(12) United States Patent
Markiz

(10) Patent No.: US 11,244,085 B2
(45) Date of Patent: Feb. 8, 2022

(54) KNOWLEDGE-BASED RECOMMENDATION SYSTEM FOR INFRASTRUCTURE PROJECT DESIGN

(71) Applicant: Nizar Markiz, Ottawa (CA)

(72) Inventor: Nizar Markiz, Ottawa (CA)

(*) Notice: Subject to any disclaimer, the term of this patent is extended or adjusted under 35 U.S.C. 154(b) by 399 days.

(21) Appl. No.: 16/235,477

(22) Filed: Dec. 28, 2018

(65) Prior Publication Data

US 2020/0210533 A1 Jul. 2, 2020

(51) Int. Cl.
| | | |
|---|---|---|
| *G06F 7/60* | (2006.01) | |
| *G06F 30/13* | (2020.01) | |
| *G06N 5/02* | (2006.01) | |
| *G06N 7/02* | (2006.01) | |
| *G06N 20/00* | (2019.01) | |
| *G06N 5/00* | (2006.01) | |

(52) U.S. Cl.
CPC .............. *G06F 30/13* (2020.01); *G06N 5/02* (2013.01); *G06N 5/003* (2013.01); *G06N 7/02* (2013.01); *G06N 20/00* (2019.01)

(58) Field of Classification Search
CPC .................................................. G06F 30/13
USPC ............................................................ 703/1
See application file for complete search history.

(56) References Cited

U.S. PATENT DOCUMENTS

2008/0243445 A1* 10/2008 Herman .................. G06F 30/13
703/1

OTHER PUBLICATIONS

Tsuda et al, "Estimating Markovian Transition Probabilities for Bridge Deteriorization Forecasting.", 2006.*
Ledesma, Sergio et al. "Practical considerations for simulated annealing implementation", Simulated Annealing, School of Engineering—University of Guanajuato, Mexico, Sep. 2008, pp. 401-420, InTech, Vienna, Austria; Available from: http://www.intechopen.com/books/simulated_annealing/practical_considerations_for_simulated_annealing_implementation.
Chan, Lai-Kow et al. "A systematic approach to quality function deployment with a full illustrative example", Omega—The International Journal of Management Science, 2005, Elsevier Ltd, 33, 119-139.
Noortwijk, J.M. Van et al., "Gamma processes and peaks-over-threshold distributions for time-dependent reliability", Reliability Engineering & System Safety, 2007, Elsevier Ltd, 92(12), 1651-1658.

(Continued)

*Primary Examiner* — Timothy A Mudrick
(74) *Attorney, Agent, or Firm* — Nixon Peabody LLP

(57) ABSTRACT

Systems and methods for data-driven recommendations during infrastructure project design. Input data, which may comprise technical data and stakeholder data, is passed to a design module. Based on that data, the design module recommends a design for the infrastructure project and recommends components to be used in the design. The design is then passed to a fleet selection module for identifying logistical needs of the design; to a cost estimation module for predicting the cost of the design; to a deterioration-forecaster module for predicting the rate of deterioration of the design components; and a scheduling module for scheduling construction tasks while accounting for logistical needs. The user is then presented with a project design and that design's logistical requirements, projected costs, likely maintenance requirements, and scheduling needs. The user may modify the design and the system may recommend additional modifications.

11 Claims, 33 Drawing Sheets

(56) References Cited

OTHER PUBLICATIONS

Markiz, Nizar et al., "An Integrated Expert System for Linear Scheduling of Heavy Earthmoving Operations", Journal of Construction Engineering, Hindawi Publishing Corporation, vol. 2016, Article ID 2312057 (17 pages).

Markiz, Nizar et al., "Integrating an Expert System with Integrated with BrIMS, Cost Estimation, and Linear Scheduling at the Conceptual Design Stage of Bridge Projects", (2018), PhD Thesis—University of Ottawa (57 pages).

Markiz, Nizar et al., "Integrating Fuzzy-Logic Decision Support with a Bridge Information Management System (BrIMS) at the Conceptual Design Stage of Bridge Design", Journal of Information Technology in Construction, 2018, ITcon, vol. 23, pp. 92-121, ISSN 1874-4753, http://www.itcon.org/2018/5.

Dreo, J. et al., "Metaheuristics for hard optimization: methods and case studies", 2006, Springer, pp. 23, 25, 30, 32, Germany (7 pages).

Markiz, Nizar et al., "An expert system to optimize cost and schedule of heavy earthmoving operations for earth-and rock-filled dam projects", Journal of Civil Engineering and Management, 2014, Taylor & Francis, ISSN 1392-3730, DOI: 10.3846/13923730.2015.1027258.

Tobochnik, Jan et al., "Teaching statistical physics by thinking about models and algorithms", American Journal of Physics, 2008, 76: 4-5, 353-359 (21 pages).

Shang, W. et al., "Time optimal linear schedules for algorithms with uniform dependencies", Proceedings of the International Conference on Systolic Arrays, 1991, 40: 6, pp. 723-742, IEEE.

Markiz, et al. "Integrating a Fuzzy Logic Decision Support System with Bridge Information Modelling and Cost Estimation at Conceptual Design Stage of Concrete Box-girder Bridges", International Journal of Sustainable Built Environment, 2014, Elsevier Ltd, 3, 135-152.

\* cited by examiner

KNOWLEDGE-BASED RECOMMENDATION SYSTEM FOR INFRASTRUCTURE PROJECT DESIGN

TECHNICAL FIELD

The present invention relates to information management. More specifically, the present invention relates to information management systems for designing infrastructure projects.

BACKGROUND

Large infrastructure projects, such as bridges, are highly complicated. The design phase of such projects involves consultations with many stakeholders, including the governments) responsible for the project, construction industry personnel, engineers and designers, and the public or bridge users. Many factors must be considered—everything from the overall shape of the bridge, to the materials used in its construction, to the most efficient and most likely schedule for the project's completion.

Currently, at the initial conceptual design stage, many of these considerations are made based on an individual's prior knowledge or instinct. The conclusions developed at this stage are therefore frequently uncertain and based on subjective conclusions. Additionally, it is very difficult to produce many different designs and compare them, as creating each design can be a highly labour-intensive process. As a result, government officials frequently have only a few designs to choose from and cannot easily make substitutions in and out of those designs.

In particular, it is especially difficult to predict how the components of an infrastructure project will deteriorate over time, due to the highly complex and erratic nature of infrastructure data. Deterministic deterioration models that can be applied easily in advance are frequently inapplicable. As a result, temporal reliability analysis "hazard functions," including though not limited to Markov chains, Bayesian networks, and gamma models, have been developed to predict deterioration values for bridge and storm sewer systems. These models have had some success, but tend to rely on vague performance indicators. Furthermore, accurate deterioration predictions are needed for planning maintenance, rehabilitation, and repair (MR&R) activities. These activities may include inspection, sampling, preventative operations, and maintenance operations. Deterioration predictions are a critical part of infrastructure asset management techniques, and thus it would be beneficial to have systems and methods that support robust, early predictions before the operational phase of the project.

Scheduling infrastructure projects is also challenging. Though there are widely accepted methods of creating linear project schedules, these methods are rarely applied at the conceptual design stage. Rather, effective linear schedules are frequently determined once construction has begun. Additionally, the schedules created at the design stage rarely account well, if at all, for the logistical needs of the project (earth-moving equipment, etc.) and this can cause the project to fall behind schedule, leading to increased costs.

In the past, several attempts have been made to develop computational tools for supporting various aspects of bridge design. However, these attempts fell short as such aspects were analyzed independently due to the unavailability of resources. Presently, few industries have incorporated integrated design into industrial processes, or have introduced broadly-accepted interoperability standards. Although the deployment of "bridge information management systems" (BrIMS) has reduced error-prone data duplication, there is still a need for better estimation of the costs and timing of bridge projects at the conceptual design stage. The following list summarizes problems identified from current practice:

There is a lack of comprehensive and economical numerical analyses of heavy earthmoving operations based on equipment performance parameters. This lack significantly affects productivity rates and optimum scheduling at the conceptual design stage.

Most scheduling techniques currently developed do not successfully predict optimum or near-optimum scheduling that accounts for heavy earthmoving operations at the conceptual design stage.

There is a reluctance to invest in preventive maintenance, resulting in repair costs that exceed annual or semi-annual maintenance costs during the infrastructure project's operational stage.

Existing expert systems do not incorporate the influence of the advancements in Computer-Integrated-Construction (CIC) computational tools and applications to bridge selection at the conceptual design stage.

In order to overcome these shortcomings, there is a need for systems and methods that can be used by stakeholders at the conceptual design stage of an infrastructure project. Preferably, these tools would enable bridge stakeholders to determine effective designs, easily consider multiple alternatives, estimate costs, determine schedules, and predict elemental deterioration at the conceptual design stage.

SUMMARY

The present invention provides systems and methods for data-driven recommendations during infrastructure project design. Input data, which may comprise technical data and stakeholder data, is passed to a design module. Based on that data, the design module recommends a design for the infrastructure project and recommends components to be used in the design. The design is then passed to a fleet selection module for identifying logistical needs of the design. The design is also passed to a cost estimation module for predicting the cost of the design. As well, the design is sent to a deterioration-forecaster module for predicting the rate of deterioration of the design components. Finally, the design is sent to a scheduling module for scheduling construction tasks while accounting for logistical needs. The user is then presented with a project design and that design's logistical requirements, projected costs, likely maintenance requirements, and scheduling needs. The user may modify the design and the system may recommend additional modifications.

In a first aspect, the present invention provides a system for predicting deterioration values of components of an infrastructure project, said system comprising:
- an input module for receiving input data related to said infrastructure project;
- a design module for determining said components, based on said input data, and for verifying said components with a user; and
- a deterioration-forecaster module for predicting said deterioration values for said components, wherein said predicting is based on said input data.

In a second aspect, the present invention provides a method for predicting deterioration values of components of an infrastructure project, said method comprising the steps of:

(a) receiving input data related to said infrastructure project;
(b) determining said components, based on said input data, and verifying said components with a user; and
(c) based on said input data, predicting said deterioration values of said components.

In a third aspect, the present invention provides a system for scheduling tasks related to an infrastructure project, said system comprising:
an input module for receiving input data related to said infrastructure project;
a design module for recommending a design of said infrastructure project to a user;
a fleet selection module for identifying logistical needs of said infrastructure project, wherein said needs are identified based on said input data; and
a scheduling module for identifying said tasks and for producing a schedule for said tasks, wherein said tasks are identified and scheduled based on said design and on said logistical needs.

In a fourth aspect, the present invention provides a method for scheduling tasks related to an infrastructure project, said method comprising:
(a) receiving input data related to said infrastructure project;
(b) based on said input data, recommending a design for said infrastructure project to a user;
(c) identifying logistical needs of said infrastructure project, wherein said needs are identified based on said input data;
(d) identifying said tasks, wherein said tasks are identified based on said design and on said logistical needs; and
(e) producing a schedule for said tasks, wherein said tasks are scheduled based on said design and on said logistical needs.

In a fifth aspect, the present invention provides a system for making recommendations related to an infrastructure project, said system comprising:
an input module for receiving project-related data from a user;
a design module for performing at least one analysis of said project-related data, and for, based on said analysis, recommending a design for said infrastructure project and components of said infrastructure project to said user;
a fleet selection module for predicting logistical needs of said infrastructure project;
a cost estimation module for predicting costs related to said infrastructure project;
a deterioration-forecaster module for predicting deterioration values of said components; and
a scheduling module for identifying tasks related to said infrastructure project and for producing a schedule of said tasks, wherein said tasks are identified and scheduled based on said design and on said logistical needs.

In a sixth aspect, the present invention provides a method for making recommendations related to an infrastructure project, said method comprising the steps of:
(a) receiving project-related data from a user;
(b) performing at least one analysis of said project-related data;
(c) based on said analysis, recommending a design for said infrastructure project and components of said infrastructure project to said user;
(d) predicting logistical needs of said infrastructure project;
(e) predicting costs related to said infrastructure project;
(f) predicting deterioration values of said components;
(g) identifying tasks related to said infrastructure project; and
(h) producing a schedule of said tasks, wherein said tasks are identified and scheduled based on said design and on said logistical needs.

BRIEF DESCRIPTION OF THE DRAWINGS

The present invention will now be described by reference to the following figures, in which identical reference numerals refer to identical elements and in which:

FIG. 16 is a screenshot of an interface for the application of FIG. 11;

FIG. 24 shows multiple screenshots from the application of FIG. 11, with editorial markings;

FIG. 25A shows multiple screenshots from the application of FIG. 11, with editorial markings;

FIG. 30 is an output table from the application of FIG. 11;

FIG. 31 is an output table from the application of FIG. 11;

DETAILED DESCRIPTION

The present invention provides systems and methods for supporting the conceptual design stage of infrastructure projects. In particular, the present invention provides a modular system for: generating a design for an infrastructure project based on comparatively little initial information; identifying logistical needs of that design; predicting the cost of the design; predicting deterioration of components of the design; and producing a schedule for the project that accounts for all relevant factors, including logistics. Further, the system of the present invention can present the results of these analyses to a user for approval. If the user does not approve, they can make or direct changes to the design, which can be easily adjusted.

Additionally, each separate module in the overall system of the present invention can be used as a standalone module or as part of a smaller system. In particular, the deterioration-forecaster module and the scheduling module can each be used as parts of smaller subsystems.

Figure 1:
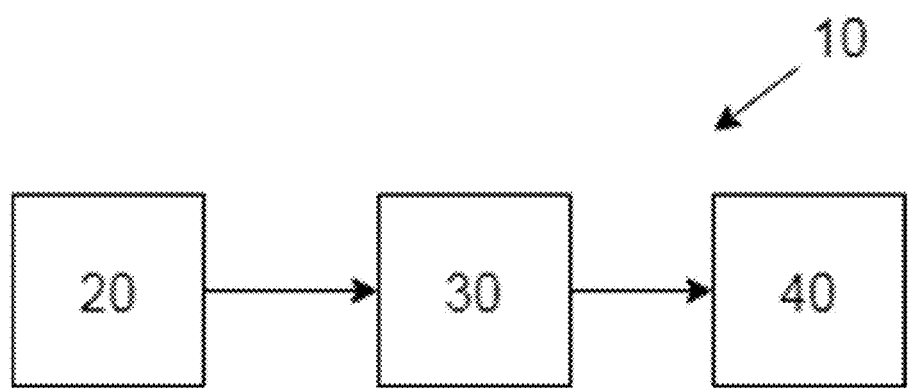
FIG. 1 is a block diagram showing a system for deterioration forecasting according to one aspect of the present invention.

Referring now to FIG. 1, the deterioration-forecaster subsystem is illustrated. In this system 10, an input module 20 receives input data from a user and passes that data to a design module 30. The input data is related to a desired infrastructure project. The design module 30 then generates a design for that project, based on the input data received, and determines what components that design will need. The design and component information is then passed to the deterioration-forecaster module 40. The deterioration-forecaster module 40 then predicts deterioration values for each of the design components. In some cases, the deterioration-forecaster module 40 may also predict overall deterioration values for the project, depending on the user's preference. The deterioration-forecaster module 40 can then ask the user(s) for approval of the predicted deterioration values. If the user approves, the system accepts the results. If, however, the user does not approve the design (for instance, if one component is liable to deteriorate much faster than the others and the user(s) would prefer deterioration at a constant rate), the users can direct the design module 30 to generate a new design. This approval process can iterate as many times as needed.

As should be noted, each module in the present invention may comprise a submodule for user approval of its output. However, user verification may also be managed, in some implementations, through a centralized module. As an example, the input module 20 might be used to verify output of modules with more complex tasks.

The deterioration values may be expressed in any meaningful format. For instance, the deterioration values may be presented as a percentage of depreciation over time (e.g., 'component X will be at 65% structural integrity within 4 years'). A characteristic pattern of deterioration may also be noted. Other formats, for instance referencing the exact parameters that will decline, are, of course, possible.

Additionally, the input module 20 may be configured to accept input data in any useful format, or for any desired fields. For instance, if the system 10 is used to forecast deterioration of a certain bridge design, the input module may require the predicted bridge span. A user might provide that span value to the input module 20 as a numerical value (e.g. as an integer, float, or some in some other numerical format). Alternatively, the user might input the span using a mapping tool. In such a case, the user could draw a line from one proposed end of the bridge to the other. The mapping tool could then calculate the length of the resulting span. As would be understood by the person skilled in the art, many other forms of input may be used.

In general, it is preferable to have as much input data as possible. As the amount of input data provided increases, the likelihood of producing a useful design that accords with stakeholders' wishes increases. On the other hand, when very little input data is provided, there is a correspondingly low chance of resulting in a broadly accepted design. Thus, when little is known about the stakeholders' desires for a project, more designs may need to be created before an effective and acceptable design can be found.

Therefore, it may often be preferable to survey the various stakeholders in an infrastructure project before beginning the conceptual design phase. There are four main categories of stakeholders in such projects: government officials, designers/engineers, construction industry personnel, and the public. Obtaining a broad range of opinions and intentions regarding each project can help inform the resulting design and can reduce the number of necessary revisions.

Of course, many survey methodologies and criteria are known in the art and may be used to obtain such opinions. One methodology, specifically designed for gathering opinions on infrastructure projects, may be referred to as the "WHATs" criteria (as in, "WHAT is important in this project"). This system asks stakeholders to individually rank each of seven project characteristics on a scale from 1 to 9. The seven criteria are:

1. technical factors ($W_1$);
2. functional factors ($W_2$);
3. safety ($W_3$);
4. construction ($W_4$);
5. economics ($W_5$);
6. aesthetics ($W_6$); and
7. materials used ($W_7$).

As would be clear to the person skilled in the art, various sub-factors for each of these criteria may be evaluated. Different sub-factors may be considered depending on the infrastructure project under consideration. For instance, "technical factors" for a bridge project may comprise such sub-factors as "design requirements", "code compliance", and "load-bearing capacity". "Functional factors" for the same bridge project may comprise such sub-factors as "traffic capacity", "freight efficiency", and "sustainability". Safety criteria for a bridge may comprise a parapet wall, protective shields, and traffic barriers, while the "construction" criteria to be ranked may comprise the methodology, accessibility for inspections, and traffic diversification plans. Potential economic criteria to be ranked could comprise direct and indirect costs, allocation of funding, and a benefit/cost ratio, while potential aesthetic criteria may be the overall architectural design, differences in urban and suburban perspectives related to the project, and the attraction value of the project for tourism. In the "material" criteria category, sub-factors such as the materials' environmental durability, environmental impact, and maintainability may be considered. Again, these suggested factors are non-exhaustive and may be adjusted to reflect concerns associated with any specific project.

Additionally, a survey may be configured so that stakeholders are asked to rank separate components of an infrastructure project according to the WHATs criteria and/or other criteria. For instance, aesthetic concerns may be more important for more visible components of an infrastructure project Final scores for each factor can then be computed based on the survey results. In one implementation, the rank values from 1 to 9 represent a 9-point symmetrical triangular fuzzy logic number (STFN) scale. In such an implementation, both fuzzy scores (incorporating rank values that are close to each other) and 'crisp' scores may be computed. The resulting final scores thus indicate stakeholders' perceptions of the importance of each factor in the final design.

Figure 2:
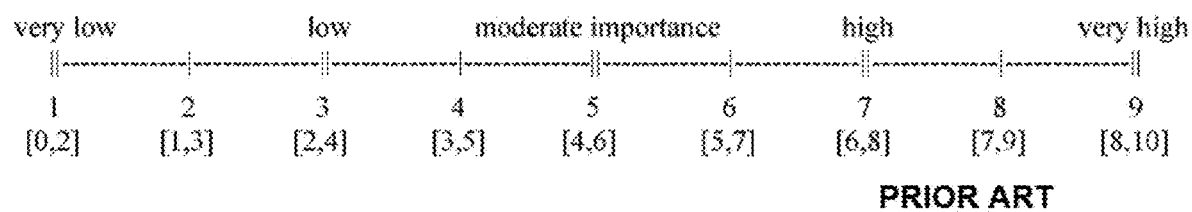
FIG. 2 is a prior art image, showing a scale that may be used to calculate relative importance values of infrastructure project components.

Such a scale can be seen in FIG. 2. Here, each range of values that is incorporated when computing a fuzzy score is shown in square brackets under the scale line. The crisp score values are the single numbers above the ranges. Note that this image is prior art and may be found in Chan & Wu, "A systematic approach to quality function deployment with a full illustrative example" (2005), Omega, Elsevier Ltd, 33, 119-139, the entire contents of which are hereby incorporated herein by reference.

Once the design has been completed, the deterioration-forecaster module 40 predicts deterioration values for the components of the project. The deterioration-forecaster module 40 may use a variety of known and/or models, depending on the specific implementation and purpose of the system.

As an example, in one implementation, a deterioration-forecaster module may be configured to predict the deterioration of a bridge. Typically, bridge deteriorations are mainly caused by chemical and/or physical mechanisms that significantly affect the material used in the bridge components. As is well-known in the art, the deterioration of an aging bridge is typically modelled as a function of its resistance capacity. The deterioration function can be defined as follows:

$$D(t) = R_0 - R(t_k) \quad (1)$$

where $D(t)$ is the deterioration function, R is the initial resistance, and $R(f_k)$ is the resistance at time k. This definition may be found in Van Noortwijk et al., "Gamma processes and peaks-over-threshold distributions for time-dependent reliability", (2007), Reliability Engineering & System Safety, 92(12), 1651, the entirety of which is hereby incorporated herein by reference.

The deterioration function is assumed to be an ascending-order process with independent deterioration time intervals. For instance, suppose a sequence of shock load effects occur at discrete times such that the overall bridge service period is divided into independent time intervals. Hence, the resistance deterioration function, $R(t_k)$, at time $t_k$, is represented as the following equations:

$$R(t_k) = R_0 \times D(t_k) \quad (2)$$

$$D(t_k) = 1 - \sum_{i=1}^{k} G_i \quad (3)$$

where $k = 1, 2, \ldots n$ and where $R_0$ is the initial resistance; $D(t_k)$ is the deterioration at time $t_k$; and $G_i \sim Ga(\gamma, \beta)$, denoting a gamma function with the shape parameter, $\gamma$, and the scale parameter, $\beta$. This deterioration function can then be used, along with regression techniques and other statistical tools, to predict the deterioration of a given bridge at time $t_k$. Additionally, information gathered from the input data may be used to further refine the model(s) used, based on, for instance, the well-known House of Quality technique.

Note that equation (2) is a descending-order process with a corresponding mean and variance calculated as in the following equations:

$$\mu[D(t_k)] = 1 - \beta \times \sum_{i=1}^{k} \gamma_i \quad (4)$$

$$\sigma^2[D(t_k)] = \beta^2 \times \sum_{i=1}^{k} \gamma_i \quad (5)$$

where; $k = 1, 2, \ldots n$ $$\gamma_i^* = \kappa \times (t_i^\gamma - t_{i-1}^\gamma) \quad (6)$$

where $\mu$ is the mean; $D(t_k)$ is the deterioration at time $t_k$; $\sigma^2$ is the variance; $\gamma_{i*}$ is the deterioration parameter; $\beta$ is the scale parameter; and $\kappa$ is the rate of deterioration. Note also that the scale and shape parameters presented herein are assigned as deterioration parameters of random variables and are determined independently.

Typically, bridge element conditions are evaluated by conducting site inspections based on municipal and/or national standards. These inspections contribute significantly towards the resistance deterioration condition of bridge elements and reflect their existing state, which may be predicted as a ratio of the existing deterioration resistance to its initial resistance, as in the following equation:

$$D(t_k) = \frac{R_k}{R_a} \quad (7)$$

where $D(t_k)$ is the deterioration function at time $t_k$; $R_k$ is the current resistance deterioration function at time $t_k$; and $R_0$ is the initial resistance. The existing resistance deterioration function $R_k$ and the initial resistance $R_0$ are typically estimated according to bridge design manuals and national code standards. Bridge deterioration resistance, however, is rarely assessed due to the high costs of the process. Thus, very little or no information on existing current bridge resistance is available, and must be estimated based on records of previous bridges.

In order to estimate the deterioration parameters (β) and (γ), the shape and scale deterioration function presented in equation (7) can be used to determine the deterioration of similar existing bridges k, with a corresponding service life of $t_1, t_2, \ldots t_k$. By substitution, the deterioration function can be presented as follows:

$$1-D(t)_i = \beta \times \kappa \times (t_i)^\gamma \text{ where; } i=1,2, \ldots k \quad (8)$$

where $D(t_i)$ is the deterioration at time $t_i$; β and γ are the random shape and scale deterioration parameters; and κ is the rate of deterioration. Then, $$\ln(1-D(t)_i) = \ln(\beta \times \kappa) + \gamma \ln(t_i) \quad (9)$$

The deterioration parameters can then be estimated graphically by regression analysis of previous similar bridges' deterioration data; where the slope γ is the ratio of $\ln(1-D(t_i))$ to $\ln(t_i)$ and the y-intercept is $\beta \times \kappa$. In equation (5) above, the variance does not account for the dynamic nature of the temporal deterioration function. Hence, an average variance formulation is used, as in the following equation:

$$\hat{\beta}^2 \times \hat{\kappa} \times \sum_{i=1}^{k} t_i^{\hat{\gamma}} = \sum_{i=1}^{\kappa} \left(D(t)_i - \hat{D}(t_i)\right)^2 \quad (10)$$

where;

$$\hat{\beta} = \frac{\sum_{i=1}^{k}\left(D(t)_i - \hat{D}(t_i)\right)^2}{\hat{\beta} \times \hat{\kappa} \times \sum_{i=1}^{k} t_k^{\hat{\gamma}}} \text{ and } \hat{\kappa} = \frac{\hat{\beta} \times \hat{\kappa}}{\hat{\beta}}$$

where $\hat{\gamma}$ and $\hat{\beta}$ are the estimated shape and scale deterioration parameters respectively; $\hat{\kappa}$ is the estimated rate of deterioration; $D(t_i)$ is the deterioration at time $t_i$; and $\hat{D}(t_i)$ is the estimated deterioration at time $t_i$.

For further detail regarding this bridge example, reference may be made to Markiz, "An Expert System Integrated with a Bridge Information Management System (BrIMS), Cost Estimating, Deterioration Forecasting, and Linear Scheduling at the Conceptual Design Stage", PhD Thesis—University of Ottawa, 2018, (hereinafter Markiz), the contents of which, in their entirety, are hereby incorporated herein by reference. In particular, note that Chapters 4 through 7 of Markiz consist of the following scientific papers:

Markiz and Jrade, "Integrating a Fuzzy Logic Decision Support System with Bridge Information Modelling and Cost Estimation at Conceptual Design Stage of Concrete Box-girder Bridges", *International Journal of Sustainable Built Environment*, 2014;

Markiz and Jrade, "An Integrated Expert System for Linear Scheduling of Heavy Earthmoving Operations", *Journal of Construction Engineering*, 2016; and Markiz and Jrade, "Integrating Fuzzy-Logic Decision Support with a Bridge Information Management System (BrIMS) at the Conceptual Design Stage of Bridge Design", *Journal of Information Technology in Construction*, 2018, each of which is therefore incorporated herein by reference in its entirety. Likewise, any references referred to in Markiz are also each incorporated herein by reference, in their entirety.

Additionally, in some implementations, the deterioration-forecaster module 40 may compare the proposed design to previous known data gathered from similar projects. Such data may be stored in a database that is operatively connected to the deterioration-forecaster module 40. Alternatively, the deterioration-forecaster module 40 may use machine-learning methods to predict the deterioration of the components. For instance, the deterioration-forecaster module 40 may comprise a trained neural network that has learned to predict deterioration patterns of components by examining previous designs.

Figure 3:
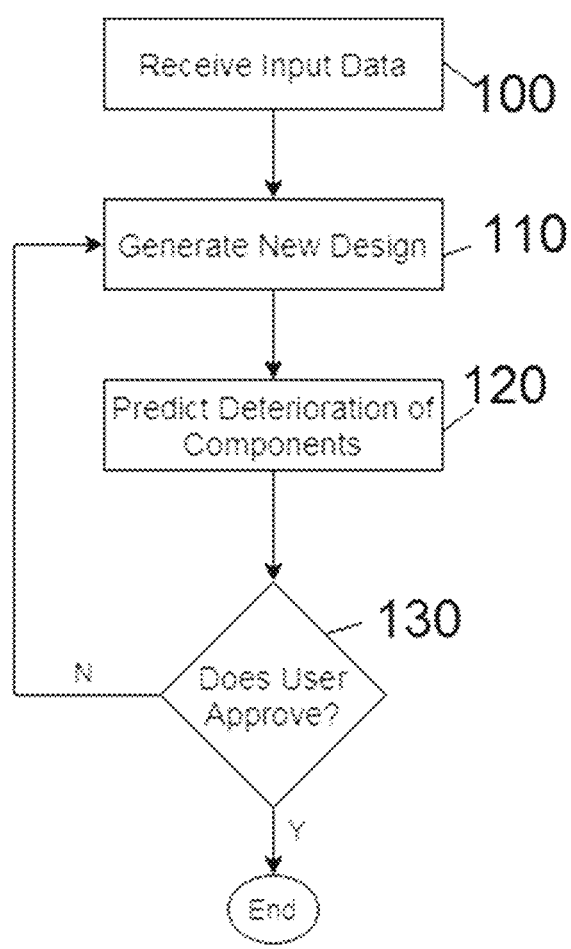
FIG. 3 is a flowchart detailing a method for deterioration forecasting according to another aspect of the present invention.
Figure 4:
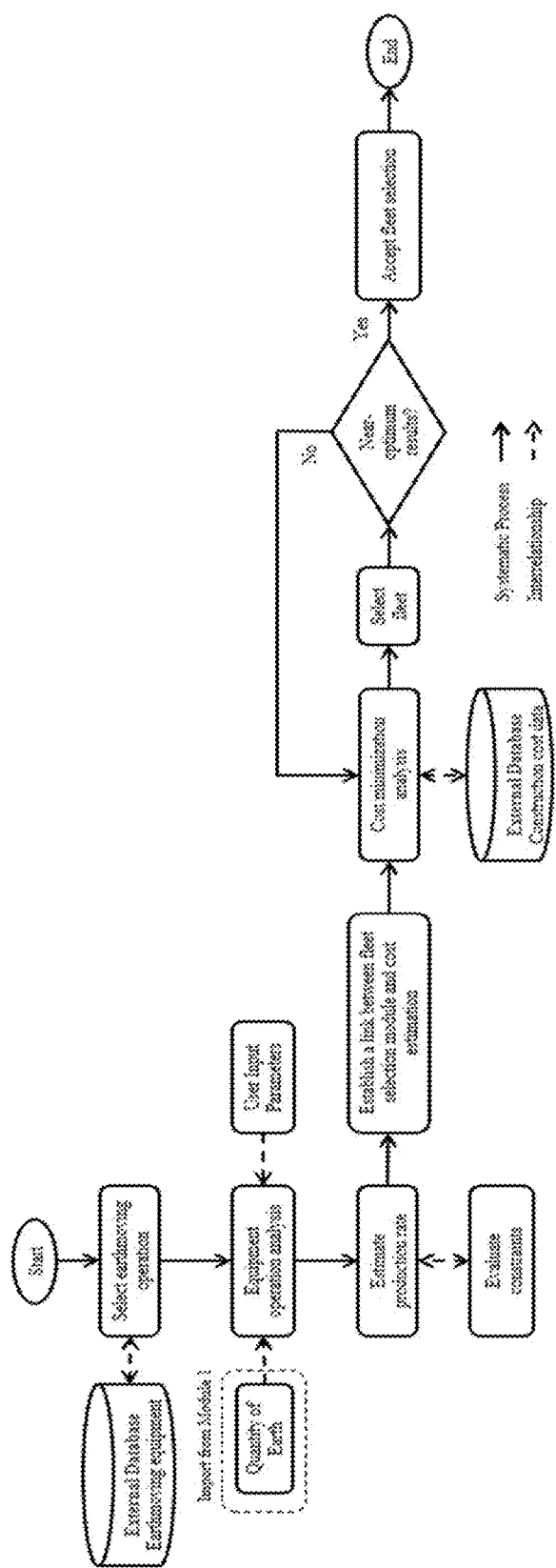
FIG. 4 is a flowchart detailing a specific implementation of the method in FIG. 2.

Referring now to FIG. 3, a flowchart detailing a deterioration-forecasting method according to an aspect of the present invention is illustrated. At step 100, input data related to a desired project is received from a user. At step 110, based on that input data, a design for the project is generated. Deterioration values for components of that design are then predicted at step 120. At step 130, the deterioration values are presented to the user. If the user accepts the deterioration values, the method ends. However, if the user does not accept the deterioration values, the method continues at step 140, where the design is modified. The method then returns to step 120, where deterioration values for the new design are predicted. FIG. 4 shows a more detailed implementation of the flowchart in FIG. 3, using the bridge example suggested in Markiz. (This example will be discussed in more detail below.)

Figure 5:
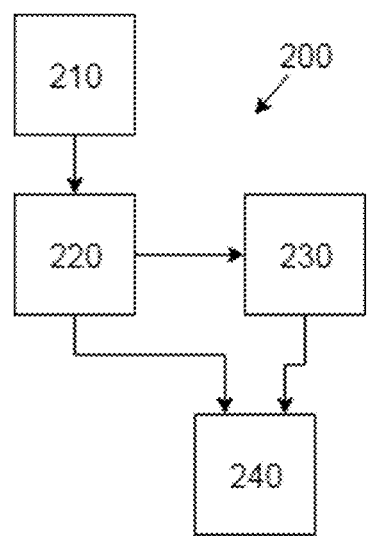
FIG. 5 is a block diagram showing a system for task scheduling according to another aspect of the present invention.

Referring now to FIG. 5, a scheduling subsystem of the present invention is illustrated. This system 200 uses an input module 210, which, like the input module in the deterioration-forecaster subsystem, receives input data related to the proposed project. A design module 220 then analyses that input data and generates a design for the project based on the input data. The design is then passed to a fleet selection module 230. The fleet selection module 230 analyses the proposed design and identifies logistical needs for the project (for instance, that the project would require the use of x earth-moving trucks for y days). As part of identifying the logistical needs, the fleet selection module 230 also determines productivity rates for each required activity, based on user input data and numerical analyses. Those logistical needs are then passed to a scheduling module 240. The scheduling module 240 analyses the design generated by the design module 220 and the logistical needs of the project to identify the tasks that the design requires. The scheduling module 240 then generates a schedule for those tasks. The schedule is presented to a user. The user may accept, reject, or modify the proposal.

The scheduling module 240 generates the schedule in several steps. First, the productivity rates determined by the fleet selection module 230 are automatically imported and plotted into a histogram. These rates are then organized so that a statistical normal distribution can be fitted accordingly, followed by a well-known stochastic linear scheduling process (also known as repetitive scheduling or a 'line of balance' process). The resulting 'line of balance' schedule is then refined via a simulated annealing approach, accompanied by a global optimization objective function which automatically detects and adjusts for time and space buffer conflicts. The scheduling module 240 then presents the schedule to the user(s). The user(s) may then accept the schedule or modify activity durations to resolve conflicts and to reach a more desirable linear schedule.

In order to determine a near-optimum linear schedule, a duration domain to execute a task must be defined. This is a parallel minimization problem and may be approached using a well-known class of algorithms, known as 'uniform dependence algorithms'. Such a uniform dependence algorithm may be represented in accordance with Shang and Fortes, "Time optimal linear schedules for algorithms with uniform dependencies," (1988), Proceedings of the International Conference on Systolic Arrays, 393-402, IEEE, the entire contents of which are hereby incorporated herein by reference, according to the following equations:

$$u(t)=y_t(u_t(t-d_t), \ldots u_t(t-d_i)) \text{ while; } t \in T; t=\{x:Ax \le b\};$$
$$T \equiv (A,b) \tag{12}$$

$$D=(d_1, d_2, \ldots d_m) \text{ while; } i=1 \ldots m; m \ge 0 \tag{12}$$

where i is an integer; t is an index point; T is the index set of vectors; $y_t$ is the numerical computation at point t; $u_t$ is the time-value function at point t; A is a matrix of dimension (a*n) with a as the number of constraints and n as the dimension of the domain; b is the domain constraints; D is the dependence matrix (n*m), $d_i$ is the dependence matrix vector, and m is the number of dependence vectors. In some implementations, the matrix A is a schedule-constraint matrix, wherein a is the number of time and space buffer constraints. Two index points from the index set (e.g., $t_1$ and $t_2$ from T) can be assigned to two interdependent activities such that $t_1 < t_2$ and $t_2 = t_1 + d_i$ for $d_i \in D$.

A linear schedule vector Π for the uniform dependence algorithm can then be established by a mapping function, $\sigma_\pi$, such that for a random index point, $\sigma_\pi(t) = [\Pi_t + c]$, subject to the constraints:

$$t \in T, \sigma_\Pi(t_1) < \sigma_\Pi(t_2), \Pi D \ge 1$$

and the time buffer constraint c=−min(Πt, t∈T) which is the offset (c).

In other words, the process of determining a linear schedule begins by assigning time and space buffer constraints to develop a constraint matrix. Following the determination of the constraint matrix, a dependence matrix is developed to represent the number of dependent scheduling alternatives. As mentioned above, various methods, including simulated annealing, may be applied to equations (11) and (12), subject to the noted constraints.

The use of simulated annealing in this scheduling context has parallels in its more typical use in metallurgy. Typically, when a metallic substance undergoes annealing, it is heated to a temperature at which it reaches the limit of liquefaction and cooled down gradually, to form a desired solid shape with specific chemical characteristics. The final status of the substance is highly dependent upon the cooling methodology implemented. For instance, if the cooling procedure is done quickly, the substance is typically brittle and heterogeneous. On the other hand, if the cooling process is controlled gradually, the substance status is ductile and homogenous.

Typically, a simulated annealing algorithm mimics this process. An initially high 'temperature' is set and utilized to plan the perturbation, evaluation, and acceptance of the final solution by gradually decreasing the temperature via a defined numerical function. The approach may be applied to any suitable problem, including optimization problems outside the chemical or metallurgical contexts. Simulated annealing methods are typically is highly responsive to user input.

In this context, the constraints to be simulated are time and space constraints related to construction projects. For instance, the foundation of a building must typically be laid before the ground floor may be constructed. In this case, there are time and space constraints (also sometimes called time and space 'buffers') around the construction of the ground floor. In simulated annealing processes, the presumed constraint is always satisfied and controlled by the process itself. In other words, no event or task can be scheduled without its time and space buffers being met. Thus, this process will produce a logically sequenced linear schedule where further analysis to time and space constraints may be conducted.

In one implementation, a meta-heuristic metropolis algorithm can be deployed as a local minimization approach to resolve linear scheduling combinational conflicts. (The metropolis algorithm is a well-known simulated annealing tool.) Simulated annealing is usually implemented by assuming a high initial duration and produces a new solution within the "neighborhood" of the initial solution. In this implementation, each new scheduling solution is obtained by resequencing construction tasks.

Note that the probability of acceptance of the re-configured scheduling solutions is dependent on the difference (ε) between immediate consecutive solutions, and on the overall duration (α). Once accepted, the new solution becomes the starting point for a consecutive minimization cycle. Consequently, the metropolis algorithm requires the following: (a) a suitable neighborhood; (b) proper probability of acceptance; and (c) effective duration-decrease rate.

Conceptually, a schedule possesses a local neighborhood only when two operations of the same ranking are substituted. Typically, task rankings are determined through a topological sorting technique. The concept of topological sorting, as is well-known, is based on transforming a 'partial order' to a 'total order'. For instance, if a>b and b>c, then a>c. Hence, an implementation of the scheduling module that uses simulated annealing methods proceeds by generating multiple solutions by substituting operations with similar rankings. Once a solution is generated, neighborhood operations are assigned ranks along with a corresponding execution order for each ranked operation. For instance, operations A and B may each be assigned rank one, while operation B precedes operation A in terms of order of execution. In the next solution, operations B and A may be reversed to result in a new scheduling solution.

Rules for accepting a solution within a simulated annealing process are an important element of the generalized metropolis algorithm. A system in its current state may be described by an N-dimensional vector (x) comprising a probability function ƒ(t) is defined. Then, a set of values that control the convergence speed of an annealing algorithm must be defined. These values can never be predicted at the initial stage. They depend on the type of minimization problem and must be adjusted accordingly.

Then, the initial number of simulations ($n_S$) is set to null. Afterwards, an initial duration ($t_0$) is typically set to some high value. The convergence of a simulated annealing algorithm, as mentioned, is generally dependent on the selection of an initial duration, $t_0$, a convergence parameter α, and a decreasing rate Δt. The decreasing rate (of the initial duration) can be determined as $\Delta t = t_i(1-\alpha)$, where $t_i$ is the current duration. As is known in the art, typical values of the convergence parameter vary between 0.8 and 0.999, with values at the higher end of the range generally being more preferable.

An initial value for the function ƒ(t) can be found as $ƒ_a = ƒ(t_i)$. A new value (after some of the time duration has elapsed) may then be found as $ƒ_b = ƒ(t_i - \Delta t)$. Then, the difference between these values of the probability function is simply $\Delta ƒ = ƒ_b - ƒ_a$. Then, if $\Delta f \le 0$, the current solution is accepted, and the simulated annealing process stops. Otherwise, if $\Delta f > 0$, the simulated annealing process will stop based on a predetermined value ε. The process may be configured to take any value of ε; however, small values, such as 0.001, are generally preferable. ε is related to the change in probability values as in the following equation:

$$\varepsilon < e^{\frac{-\Delta f}{t_i}} \quad (13)$$

Figure 6:
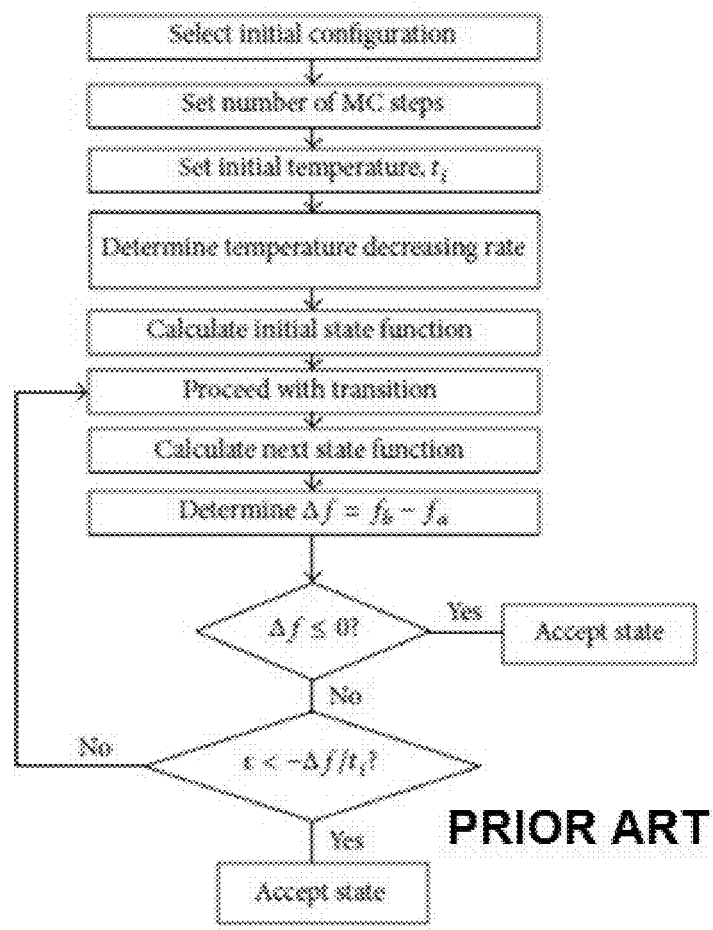
FIG. 6 is a prior art flowchart outlining a generalized simulated annealing process.

This process is illustrated in detail in a prior art flowchart, in FIG. 6.

More information on simulated annealing implementation may be found in Dreo et al., "Metaheuristics for hard optimization: methods and case studies", (2006); in Tobochnik & Gould, "Teaching statistical physics by thinking about models and algorithms," American Journal of Physics, 76: 4-5, 353-359 (2008); and in Ledesma, Avina & Sanchez, "Practical considerations for simulated annealing implementation," (2008), Simulated Annealing, 401-420, InTech, Vienna, Austria. The entire contents of each of these references are hereby incorporated herein by reference.

As mentioned, the simulated annealing process works on "local neighborhoods"—that is, it rearranges nearby tasks with similar rankings. However, "global schedule optimization" (i.e., reduction of the overall time taken) is also desirable in infrastructure projects. For this task, another uniform dependence algorithm may be defined such that $\sigma_\pi$ is the linear schedule vector, using the following equations:

$$T_\Pi = 1 + \max(\sigma_\pi(t), t \in T)$$

$$T_\Pi = 1 + \max([\Pi_{t_2}] - [\Pi_{t_1}], t_1, t_2 \in T) \quad (14)$$

Again, however, other scheduling methods and schedule modification methods may be employed.

Much like the deterioration-forecaster subsystem 10, the scheduling subsystem 200 may be in operative communication with at least one database. Such a database might store known information related to the scheduling of similar infrastructure projects. As would be understood by the person skilled in the art, in a larger system (for instance, a system that combined both the deterioration-forecaster subsystem 10 and the scheduling subsystem 200), a single database might be used by modules from either system. Similarly, if the deterioration-forecaster subsystem 10 and the scheduling subsystem 200 were combined into a single system, the resulting larger system could use a single input module and a single design module.

Figure 7:
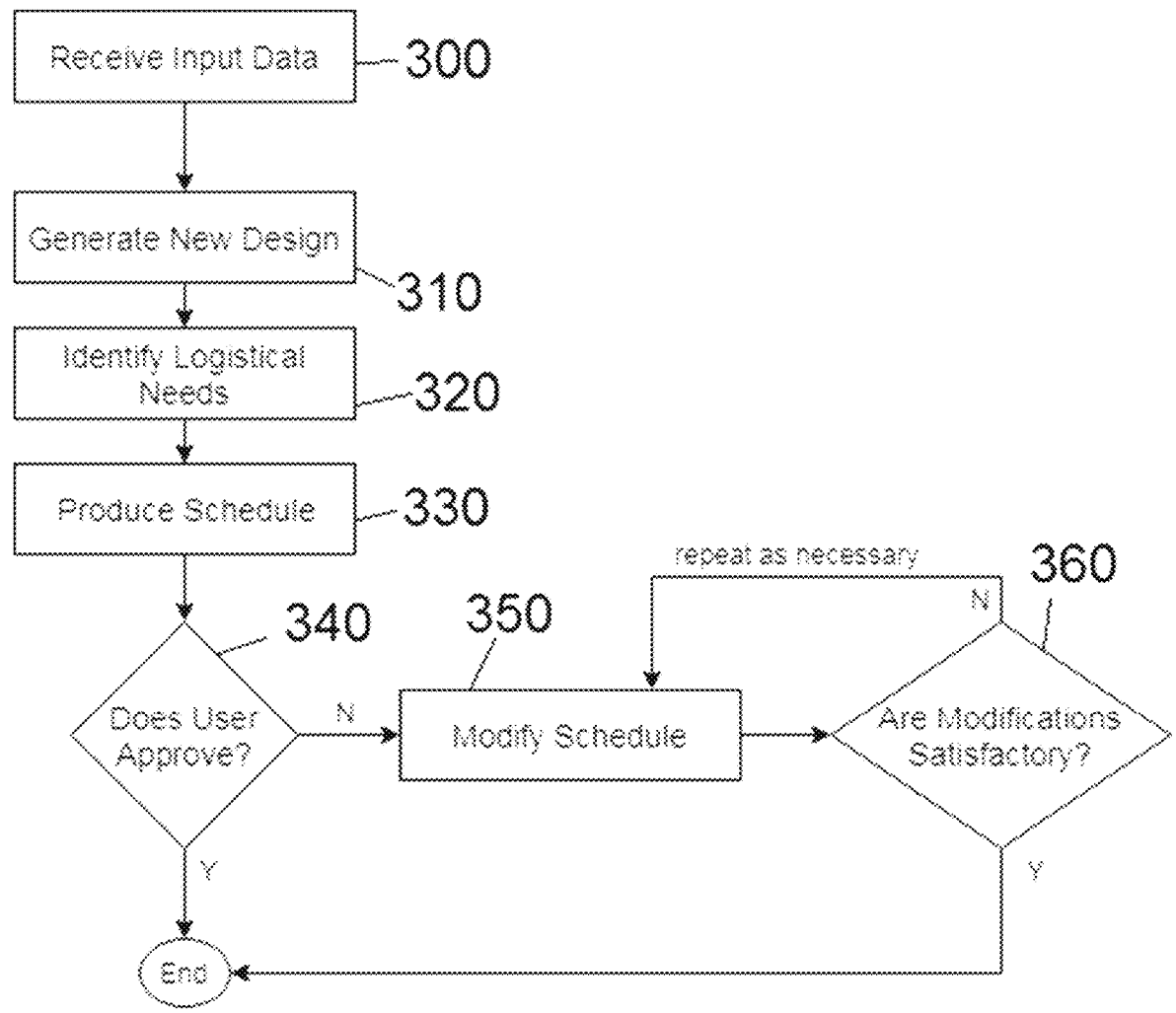
FIG. 7 is a flowchart detailing a method for task scheduling according to still another aspect of the present invention.
Figure 8:
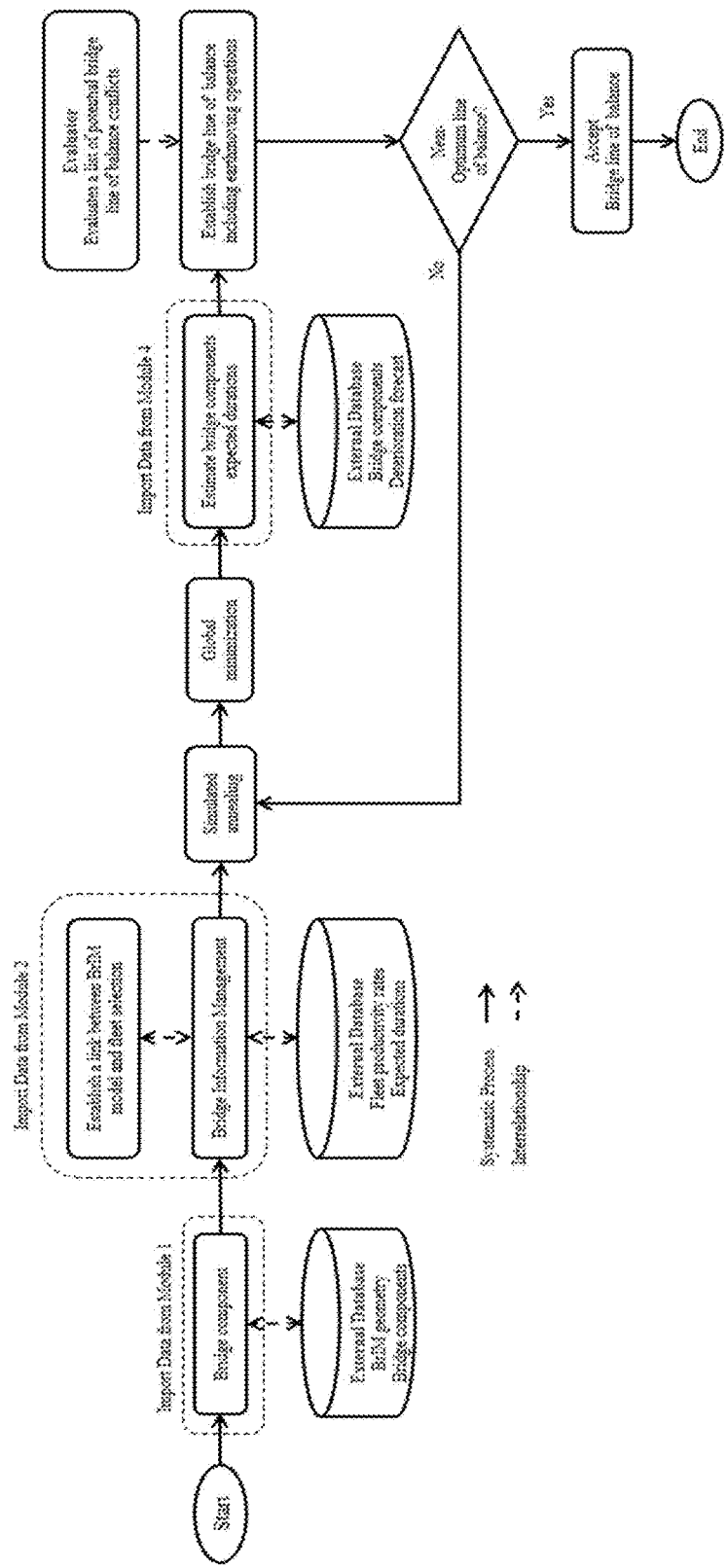
FIG. 8 is a flowchart detailing a specific implementation of the method in FIG. 7.

FIG. 7 is a flowchart detailing a method for scheduling project tasks. At step 300, input data is received. Then, at step 310, a new design is generated for the project. Next, at step 320, the logistical needs of that design are determined. The design and information on those logistical needs are then used to produce a schedule of tasks at step 330. The schedule is then presented to the user for approval (step 340). If the user approves the schedule, the method ends. On the other hand, if the user does not approve the schedule, the user can modify that schedule to obtain a more desirable scheduling arrangement (step 350). The user can continue to modify the schedule as necessary. When the user's modifications result in a more desirable schedule (as determined by a second approval step, step 360), the method ends. FIG. 8 shows a more detailed flowchart outlining a specific implementation of the method in FIG. 7, again using the bridge example suggested by the Markiz thesis.

Figure 9:
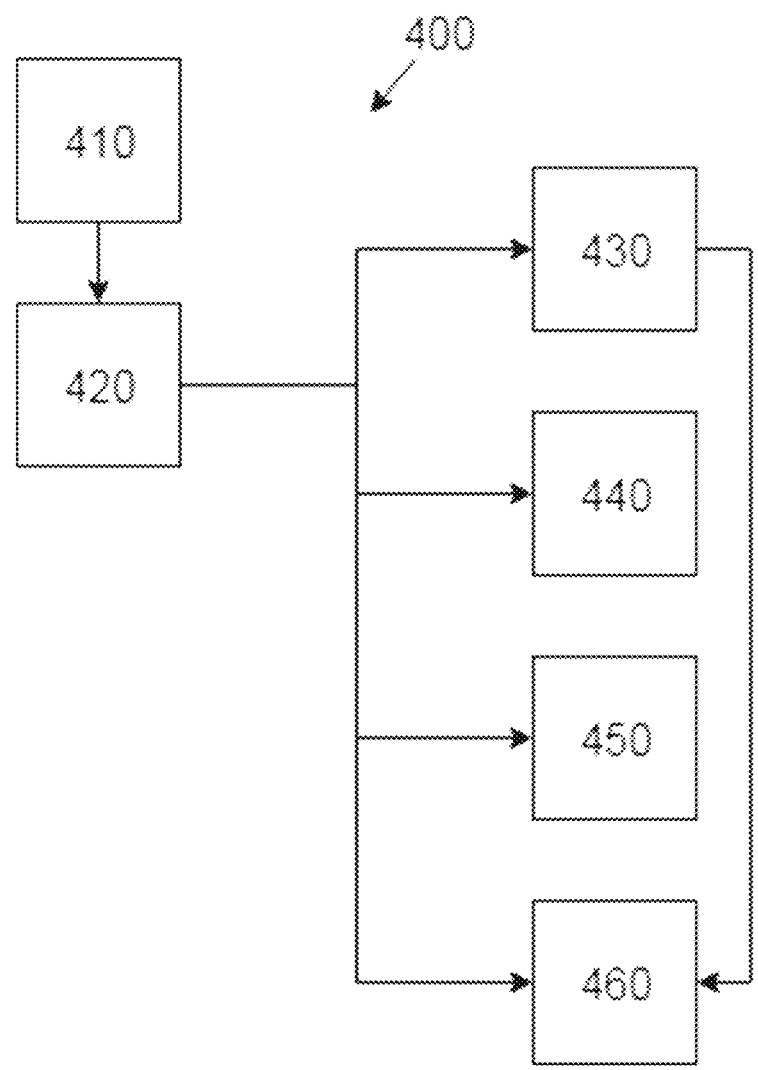
FIG. 9 is a block diagram showing a system for design recommendation according to another aspect of the present invention.

As discussed above, the modules of the invention may each be used individually. Two or three modules may also be used together in "subsystem" configurations, as in the deterioration-forecaster subsystem 10 and the scheduling subsystem 200 described above. However, the full system of the present invention incorporates several modules: an input module; a design module; a fleet selection module; a cost estimation module; a deterioration-forecaster module; and a scheduling module. The full system configured according to this scheme is shown in FIG. 9. In this system 400, an input module 410 receives input data related to the infrastructure project from a user. As discussed above, that input data may comprise technical details regarding the project, as well as results from stakeholder surveys. The input data is then passed to a design module 420 that generates a design for the project based on that data.

The design is then passed to the remaining modules: a fleet selection module 430; a cost estimation module 440; a deterioration-forecaster module 450; and a scheduling module 460. The fleet selection module 430 operates as described above, identifying logistical needs of the project. The cost-estimation module 440 uses information from the design module 420 and from the fleet selection module 430 to determine the likely cost of the current design (thus incorporating logistical costs). The deterioration-forecaster module 450 operates as described above. Likewise, the scheduling module 460 operates as described above. The user can thus be simultaneously presented with a project design and with that design's logistical requirements, projected costs, likely maintenance requirements, and scheduling needs, greatly simplifying the conceptual design stage of infrastructure projects.

Figure 10:
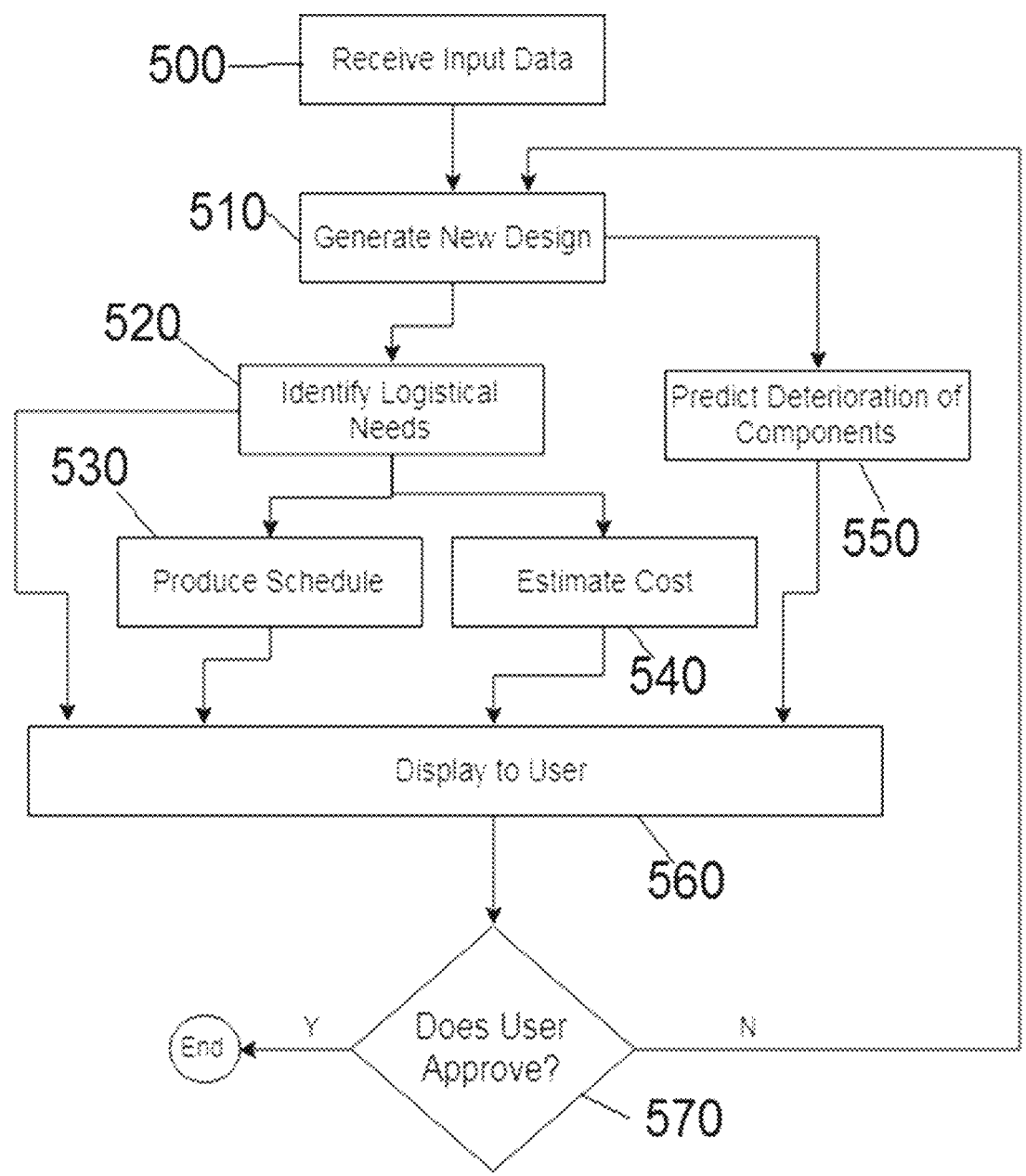
FIG. 10 is a flowchart detailing a method for design recommendation according to still another aspect of the present invention.

FIG. 10 is a flowchart detailing a full-system recommendation method, performed by a system comprising an input module, a design module, a fleet selection module, a cost estimation module, a deterioration-forecaster module, and a scheduling module. At step 500, the input data is received. Then, at step 510, a project design is generated based on that input data. At step 520, the logistical needs of the project are determined. At step 530, a schedule is produced based on those needs and on the design from step 510. At step 540, the cost of the design is estimated, and at step 550, the deterioration of the project components is estimated. At step 560, the various outputs from steps 520 to 550 are displayed to the user. Note that step 520 (identifying logistical needs) must be performed before steps 530 or 540, and that steps 520-550 should all be performed before step 560 can be performed.

Note, however, that in some cases, the user may not wish to see all the outputs simultaneously. In such cases, certain outputs may be hidden, or the corresponding steps might not be performed before the remaining outputs are displayed.

Example—Implementing a Bridge Design Recommendation System

Figure 11:
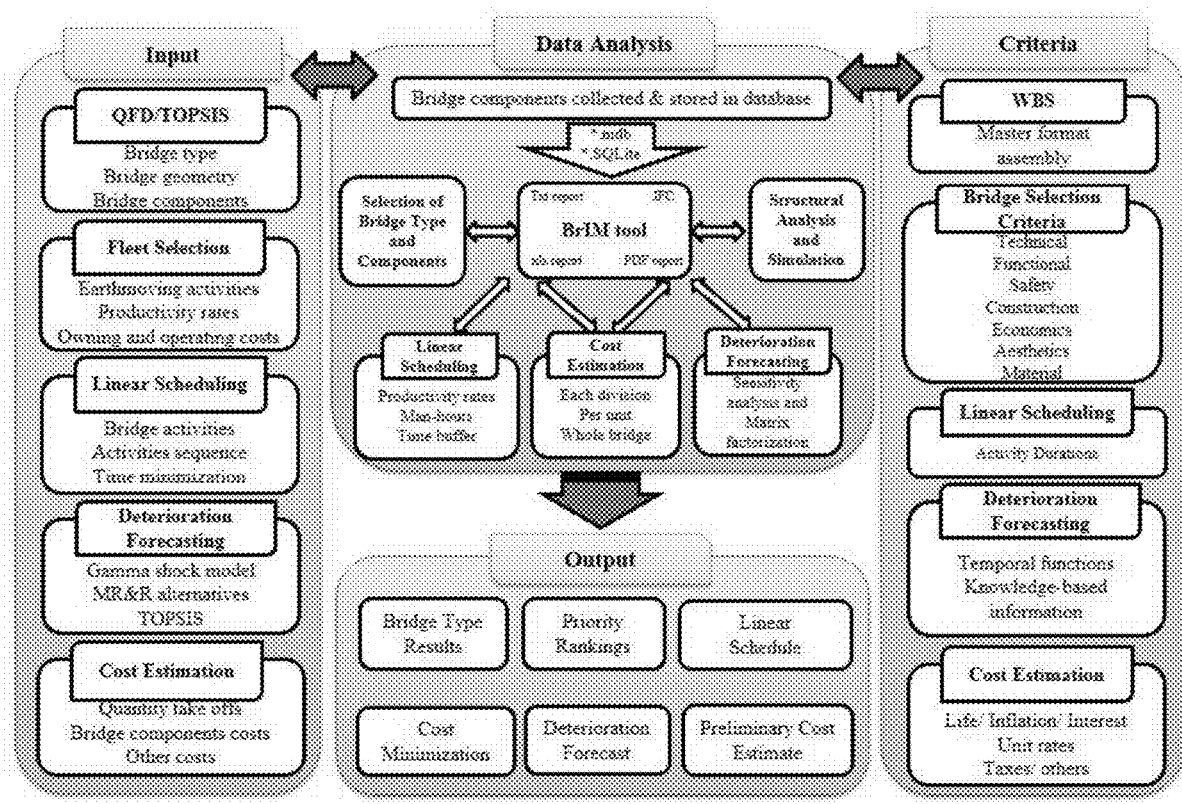
FIG. 11 is a system architecture diagram for an application that implements the system of the invention.

The systems and methods of the present invention have been applied to a recommendation system for the conceptual design of bridges (see again, Markiz). A user interface has been developed for this application. The application may be referred to as a "Bridge Information Management System" or "BrIMS". A system architecture diagram for this application is shown in FIG. 11. This diagram outlines inputs required, analyses performed, and the resulting output data.

Figure 12:
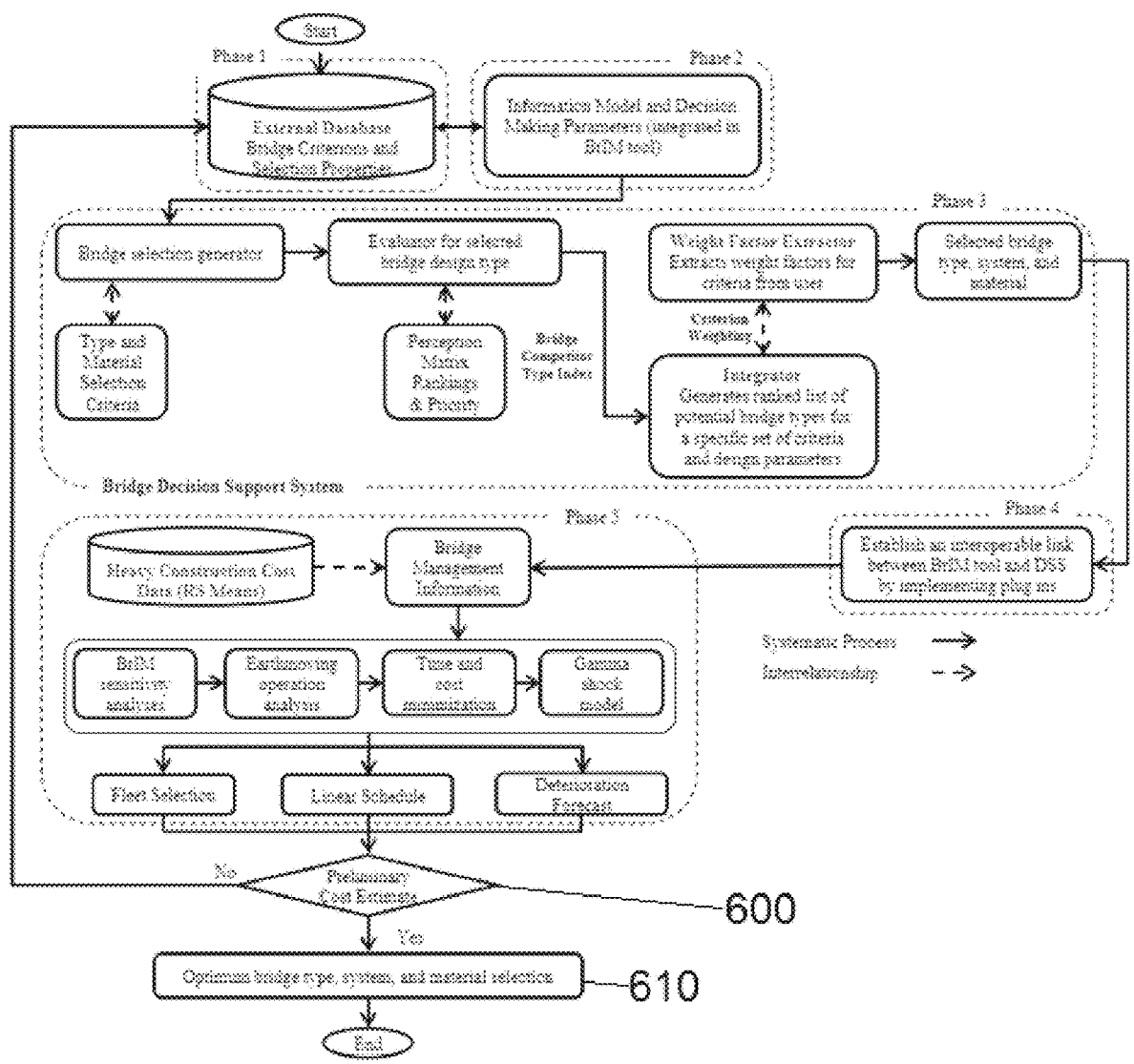
FIG. 12 is a more detailed diagram of the application of FIG. 11.

FIG. 12 is another diagram of this system, showing greater detail. "Phase 1" in this diagram refers to an external database of bridge-related information, including components and requirements, as well as survey results and historical bridge data. In "Phase 2", a 3D CAD bridge information model geometrically defined elemental bridge components. These components were stored in a library that was linked to the external database server of Phase I via interoperable extension files. Bridge elements were then associated with properties of their component materials in order to assist the user with design requirements. Bridge elements were then assigned annotations in text format in order to assist the weight factor extractor and system integrator with query-indexing and element-selection processes.

At "Phase 3", a bridge design is generated based on survey data, historical known-bridge data, and technical bridge requirements, as discussed above. Again, this design may be generated using rules-based techniques, machine learning techniques, or a combination of both. In this exemplary application system, the resulting bridge design was stored in the eternal database. Additionally, in this application system, plugin tools (which will be discussed further below) were used to mediate between the design module (i.e. "Phase 3") and the remaining modules in the system (i.e. "Phase 5").

At "Phase 5", the fleet selection module, cost estimation module, deterioration forecasting module, and the scheduling module analyze the bridge design along with various other factors and data sources. Again, these other sources potentially comprise historical bridge data. As has been discussed, these modules may comprise rules-based elements, machine learning elements, and combinations thereof. At decision 600, a preliminary cost estimate is presented to the user. If they accept this estimate, the related bridge type, system, and material are selected and finalized, at step 610. If on the other hand the user rejects the preliminary cost estimate, they can adjust the initial parameters and obtain a new recommended design.

Figure 13:
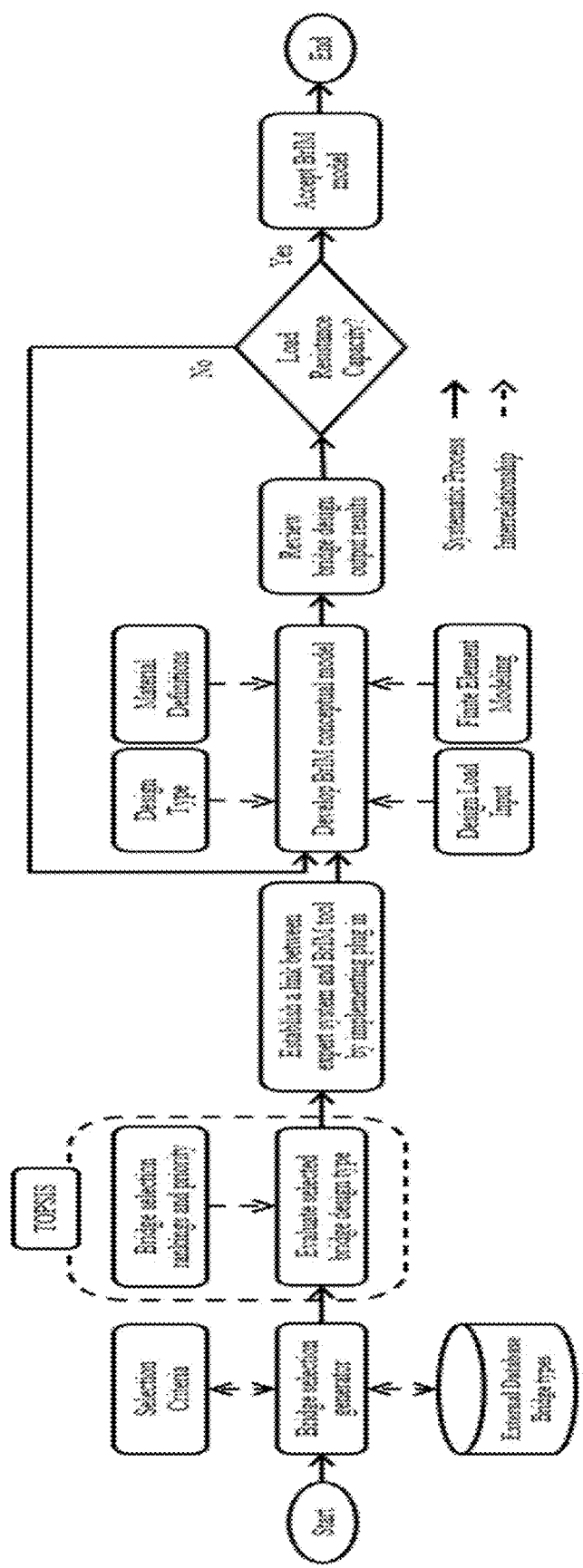
FIG. 13 is a flowchart detailing a process implemented by a design module from the application of FIG. 11.

The design process, as implemented for the BrIMS application, is shown in FIG. 13. As can be seen, the design module receives survey information ("selection criteria") and other historical and categorical information, and accounts for many different factors when developing the design.

Figure 14:
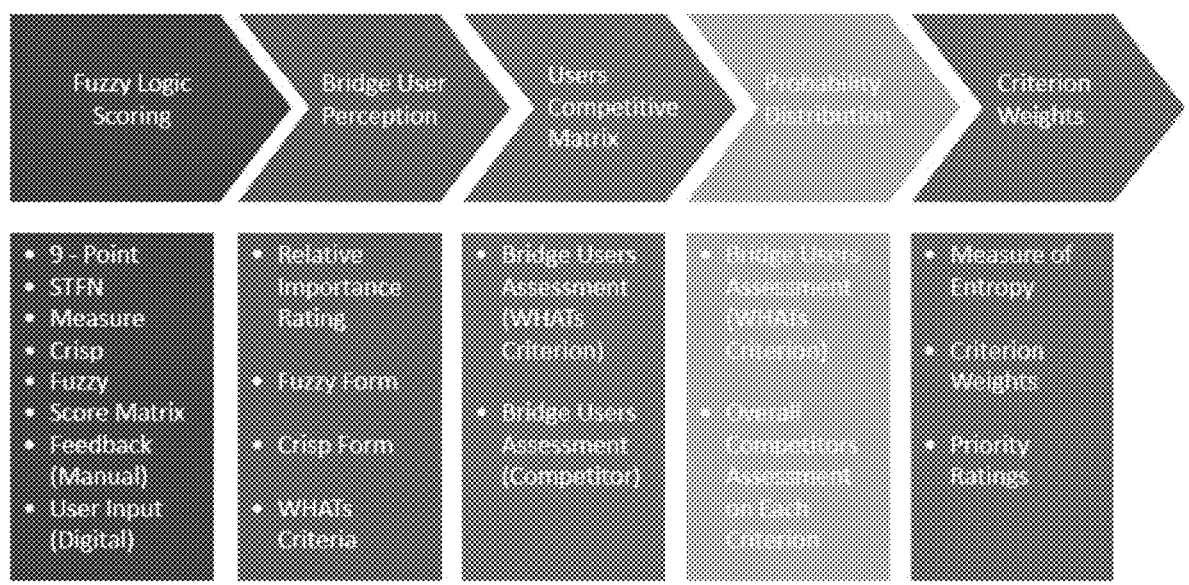
FIG. 14 is a diagram showing analysis stages for gathered input data to be used by the application of FIG. 11.

This BrIMS application uses the "WHATs" criteria described above to determine stakeholder values, as well as the well-known "TOPSIS" (Technique for Order of Preference by Similarity to Ideal Solution) decision analysis technique, in determining the initial bridge design. This technique uses the gathered stakeholder input data and takes into account the following criteria: (i) qualitative benefit; (ii) quantitative benefit; and (iii) cost criteria. A diagram of the various stages of analysis of this gathered is shown in FIG. 14.

As part of a TOPSIS analysis, the following two solutions are developed: (a) an ideal alternative in which the maximum gain from each of the criteria values is taken; and (b) a negative ideal alternative in which the maximum loss from each of the criteria values is taken. The TOPSIS analysis then selects the alternative that converges to the ideal solution and rejects the negative ideal alternative.

Before undertaking the TOPSIS analysis, a decision matrix $P^k$ is created based on the following equation:

$$P^k = \begin{array}{c} \\ C_1 \\ C_2 \\ \vdots \\ C_i \\ \vdots \\ C_m \end{array} \begin{bmatrix} x_{11}^k & x_{12}^k & \cdots & x_{1j}^k & \cdots & x_{1n}^k \\ x_{21}^k & x_{22}^k & \cdots & x_{2j}^k & \cdots & x_{2n}^k \\ \vdots & \vdots & \cdots & \vdots & \cdots & \vdots \\ x_{i1}^k & x_{j2}^k & \cdots & x_{ij}^k & \cdots & x_{in}^k \\ \vdots & \vdots & \cdots & \vdots & \cdots & \vdots \\ x_{m1}^k & x_{m2}^k & \cdots & x_{mj}^k & \cdots & x_{mn}^k \end{bmatrix} \begin{array}{c} x_1 \;\; x_2 \;\cdots\; x_j \;\cdots\; x_n \;\; \text{Criterion}(n) \end{array} \quad (15)$$

Figure 15:
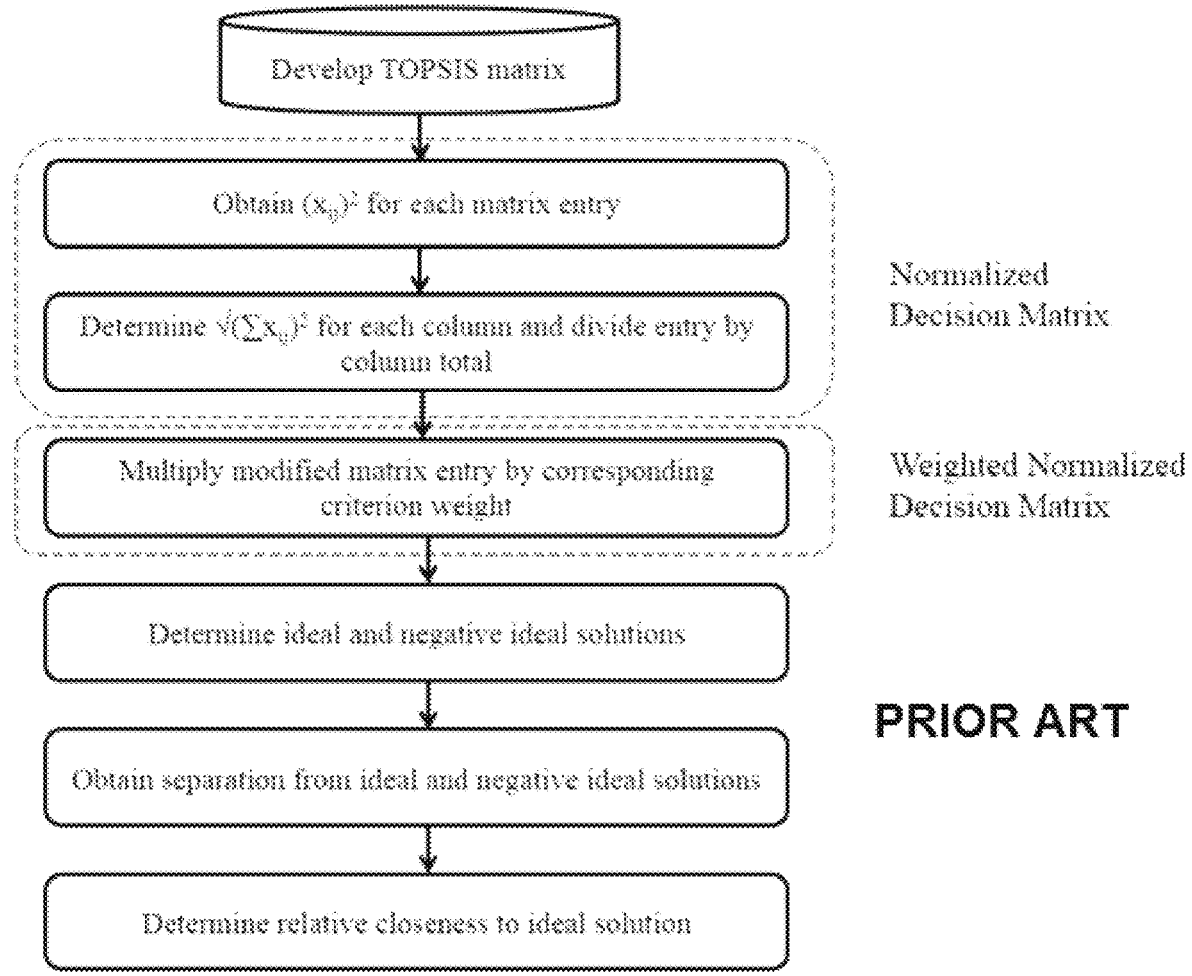
FIG. 15 is a prior art flowchart outlining a TOPSIS analysis process.

Bridge Types ($m$)

where $C_i$ is the bridge component i, i=1, ..., m, and $X_j$ is the entry value of criterion j, j=1, ..., n, such that $x_{ij}^k$ is the performance assessment rating that stakeholder k gave to the component $C_i$ based on $X_j$, for stakeholders k=1, ..., K. TOPSIS analysis then comprises the following consecutive four steps: (i) determining a normalized decision matrix; (ii) determining ideal and negative ideal solutions; (iii) determining separation measures; and (iv) determining the relative closeness to the ideal solution, as shown in the prior art flowchart in FIG. 15.

Generating the normalized decision matrix $N^k$ converts the various parametric dimensions of $P^k$ into non-dimensional parameters to allow for contrasting among criteria. In a normalized decision matrix, entry value $n_{ij}^k$ is the vector normalization of entry value $x_{ij}^k$ such that $0 \leq n_{ij}^k \leq 1$. This normalized decision matrix $N^k$ is generated according to the following equation:

$$n_{ij}^k = \frac{x_{ij}^k}{\sqrt{\sum_{j=1}^{N}(x_{ij}^k)^2}} \quad (16)$$

where $n_{ij}^k$ is thus the normalized scoring value from stakeholder k for bridge component alternative $C_i$ based on the criteria $X_j$.

A positive ideal solution ($POS^k$) and a negative ideal solution ($NEG^k$) are then determined based on the following equations:

$$POS^k = \{\max n_1^k, \ldots, \max n_n^k\} = \left\{ \left( \max_i n_{ij}^k \mid j \in J \right), \left( \min_i n_{ij}^k \mid j \in J' \right) \right\} \quad (17)$$

$$NEG^k = \{\min n_1^k, \ldots, \min n_n^k\} = \left\{ \left( \min_i n_{ij}^k \mid j \in J \right), \left( \max_i n_{ij}^k \mid j \in J' \right) \right\} \quad (18)$$

where $$\max_i n_{ij}^k$$

is the normalized decision matrix entry with highest ranking for alternative i;
is the $$\min_i n_{ij}^k$$

normalized decision matrix entry with the lowest ranking for alternative i
  J is the set of positive attributes or criteria, and thus is the maximum positive solution for i=1, . . . , m, j=1, . . . , n, k=1, . . . , K; and
  J' is the set of negative attributes or criteria and thus is the maximum negative solution for i=1, . . . , m, j=1, . . . , n, k=1, . . . , K.

An improvement goal value, G, is then introduced to the set of attributes. The improved normalized competitive rating, $IGn_{ij}^k$, for alternative i and attribute j can then be obtained from the following equation:

$$IGn_{ij}^k = G_{ij}^k * n_{ij}^k * e_m \qquad (19)$$

where $G_{ij}^k$ is the improvement goal set and $e_m$ is the importance weight associated with the alternative i.

The relative separations from the positive and negative ideal solutions for the attribute group are then calculated according to the following equations:

$$PSEP^k = \sum_{j=1}^{n} (IGn_{ij}^k - \max n_{ij}^k); \text{ for alternative } i, i = 1, \ldots, m \qquad (20)$$

$$NSEP^k = \sum_{j=1}^{n} (IGn_{ij}^k - \min n_{ij}^k); \text{ for alternative } i, i = 1, \ldots, m \qquad (21)$$

where $PSEP^k$ is the separation from the positive ideal solution and $NSEP^k$ is the separation from the negative ideal solution. Then, the relative separation from the positive and negative ideal solutions for the stakeholders group K is calculated as follows:

$$GPSEP = \{(\cdots)\}; \text{ for alternative } i, i = 1, \ldots, m \qquad (22)$$

$$GNSEP = \{(\cdots)\}; \text{ for alternative } i, i = 1, \ldots, m \qquad (23)$$

where GPSEP is the group separation from the positive ideal solution $PSEP^k$ and GNSEP is the group separation from the negative ideal solution $NSEP^k$.

Finally, the relative closeness to the ideal solution can be calculated as follows:

$$C_i^* = \frac{GNSEP}{(GPSEP + GNSEP)}; 0 < C_i^* < 1 \qquad (24)$$

where $C_i^*$ is the relative closeness to the positive ideal solution. The highest-ranked bridge component for MR&R priorities is thus the alternative component i with a $C_i^*$ value closest to the value of unity (I).

Figure 16:
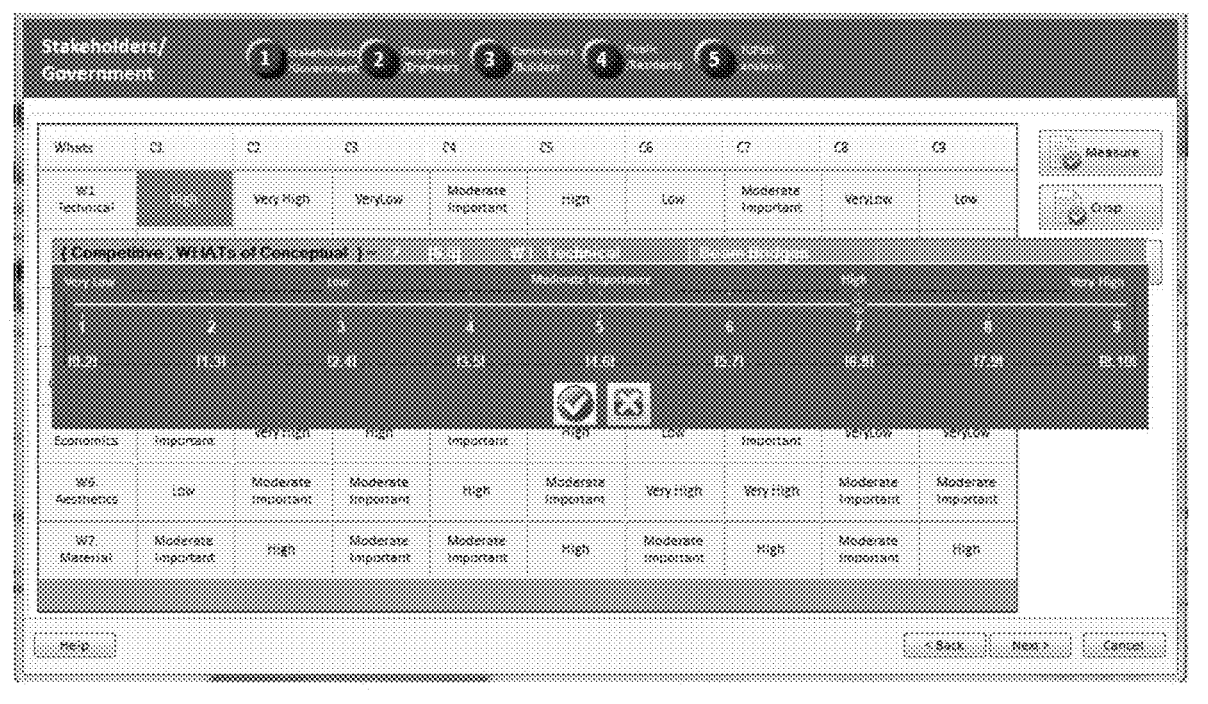
Figure 17:
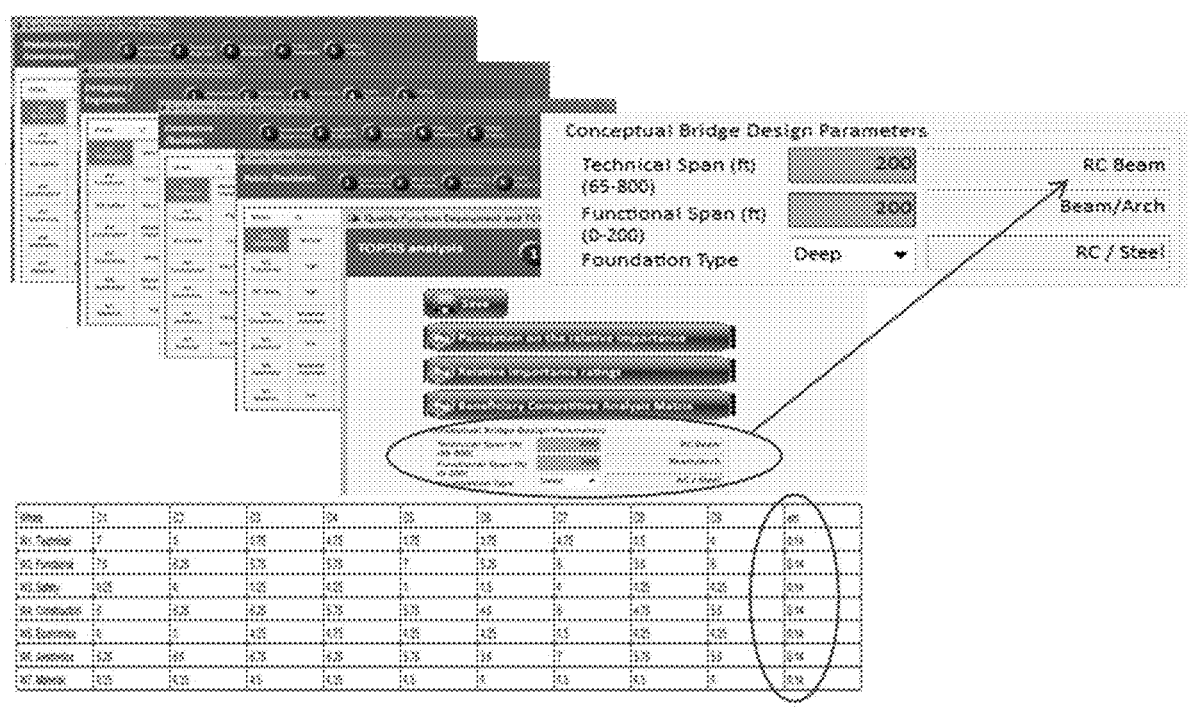
FIG. 17 shows several screenshots from the application of FIG. 11, as well as an output table from that interface.

FIG. 16 is a screenshot showing an application interface for an input module according to the system of the invention. Here, the user inputs survey results from bridge users' assessments using the WHATs criteria. In FIG. 17, the rankings of the WHATs criteria are evaluated and organized into a competitive matrix. Additionally, a probability distribution and final scores for the criterion weights are determined. As well, this figure displays an interface in which the user can enter technical data for the bridge design, including the technical and functional spans and the foundation type. On the right of that screen, the system has predicted components (RC Beam, Beam/Arch, RC/Steel) based on the technical data and the results of the TOPSIS analysis.

Figure 18:
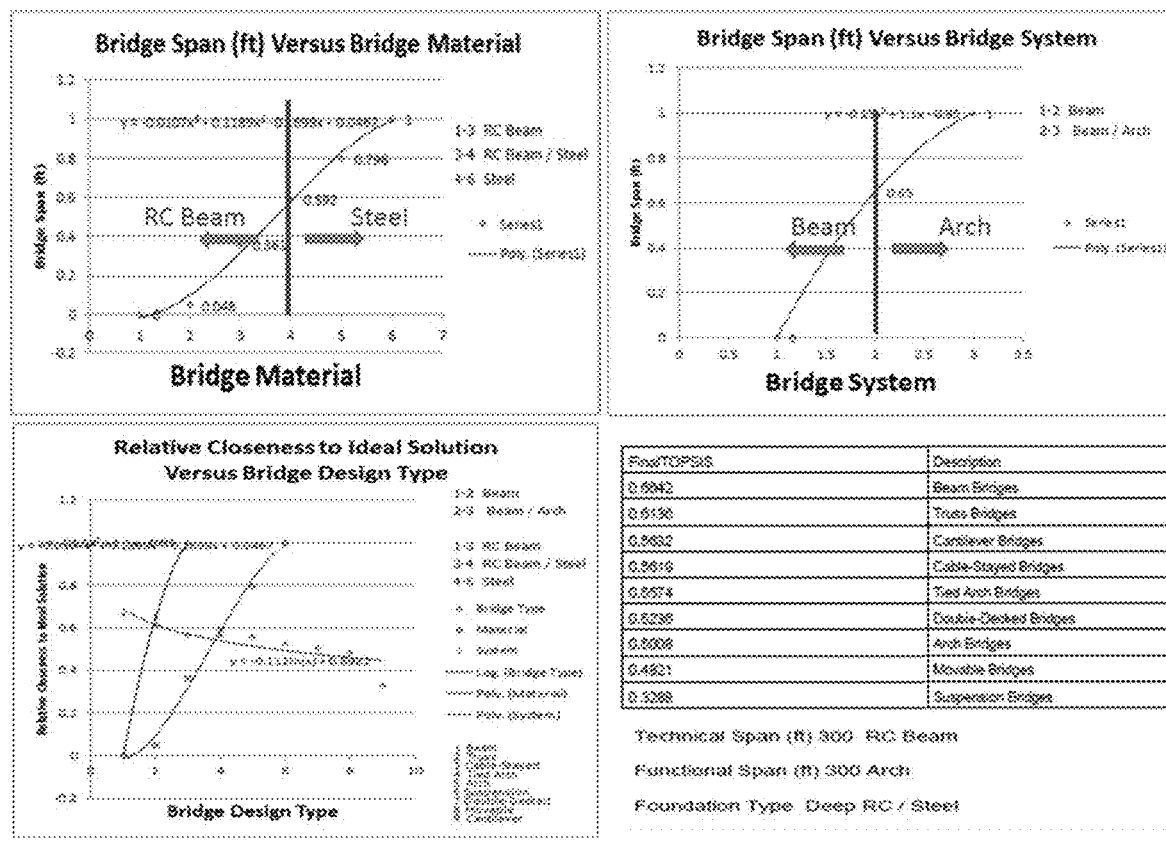
FIG. 18 shows several output results from the application of FIG. 11.

FIG. 18 shows other recommendations, based on this technical data, for the bridge material and design type. As can be seen in the chart on the bottom left, the bridge design alternative of a beam configuration possesses the highest ranking amongst the diverse alternatives, based on bridge users' relative rankings. Note the wide insight into bridge design alternatives, material, and systems to be incorporated into the bridge information model and into 'next to kin' alternatives accordingly.

Figure 19:
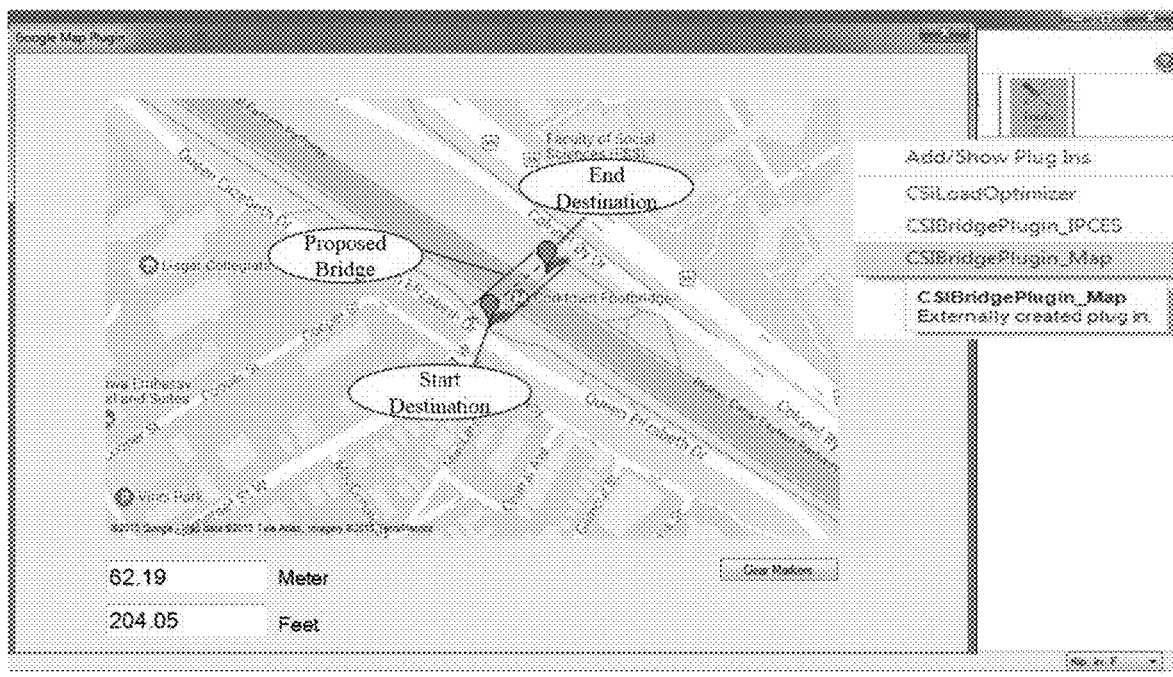
FIG. 19 is another screenshot from the application of FIG. 11.

Additionally, as part of developing this application, a plug-in algorithm was hard-coded and incorporated as a mapping tool to enable the user to instantly determine bridge total length at the conceptual design stage. This plug-in was developed within an object-oriented .NET framework using a SQLite database, which had the ability to resolve interoperability issues among internal database applications. Upon completion of TOPSIS, this application automatically runs the plug-in mapping tool. This occurs when the user clicks on the 'Advanced' tab, selects 'Tools', and proceeds with the 'CSiBridge Plugin_Map' option to specify the initial and final destinations of the desired bridge project. The tool then presents the user with the total bridge length as shown in FIG. 19 (at bottom left).

Once total bridge length is identified, the user can input further parameters into the design module that define geometric constraints. For instance, the user might input geometrical parameters related to segmental bridge girders. Once all the geometrical parameters related to bridge design are provided, a resulting bridge design is developed and stored in a database. That design is then be used for the other system modules as necessary.

Fleet Selection

Figure 20:
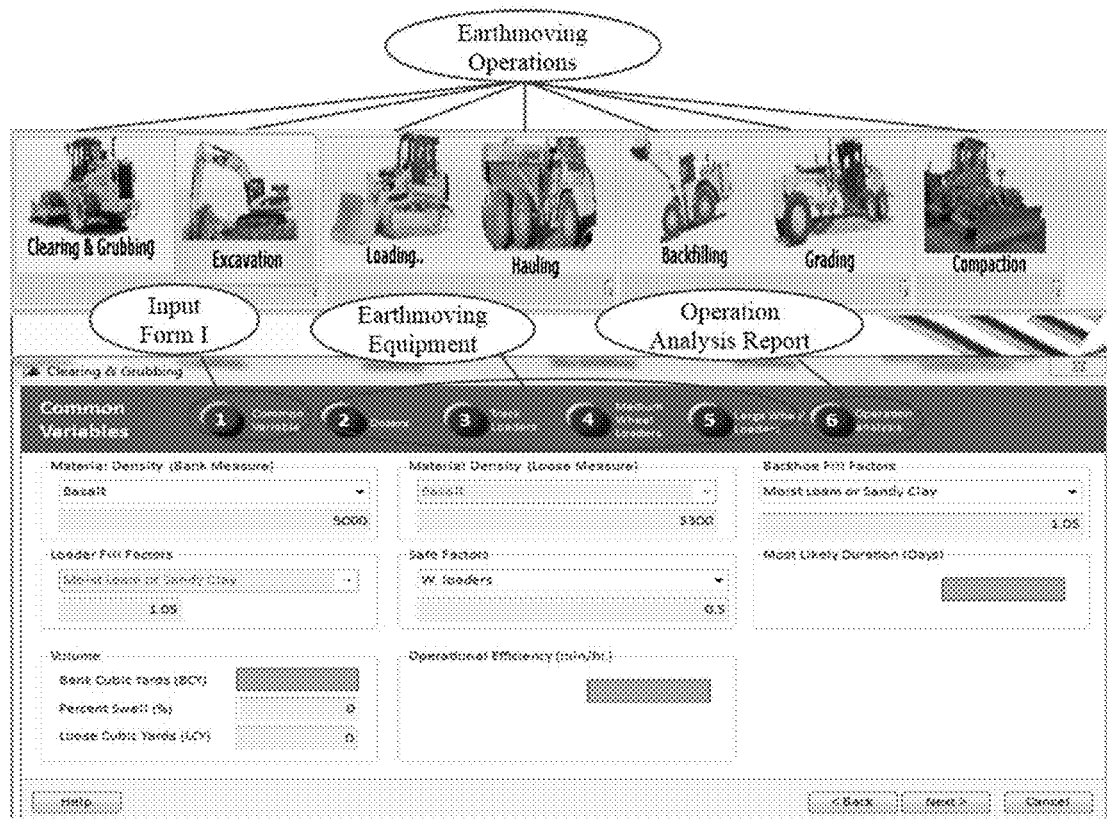
FIG. 20 is another screenshot from the application of FIG. 11, with editorial markings.

Following use of the mapping plugins, the system automatically guides the user to the fleet selection system gateway, a screenshot of which is shown in FIG. 20. (A further plug-in tool was embedded into the mapping plug-in, in order to direct the user to the 'Fleet Selection' module following conceptual bridge design.) Once the user selects the desired earthmoving operation, the application displays an input form where necessary parameters related to the scope of work may be inputted. Within each operation, input forms that include common variables are automatically extracted and stored in an external database in order to proceed with the numerical analysis of the earthmoving operations.

Figure 21:
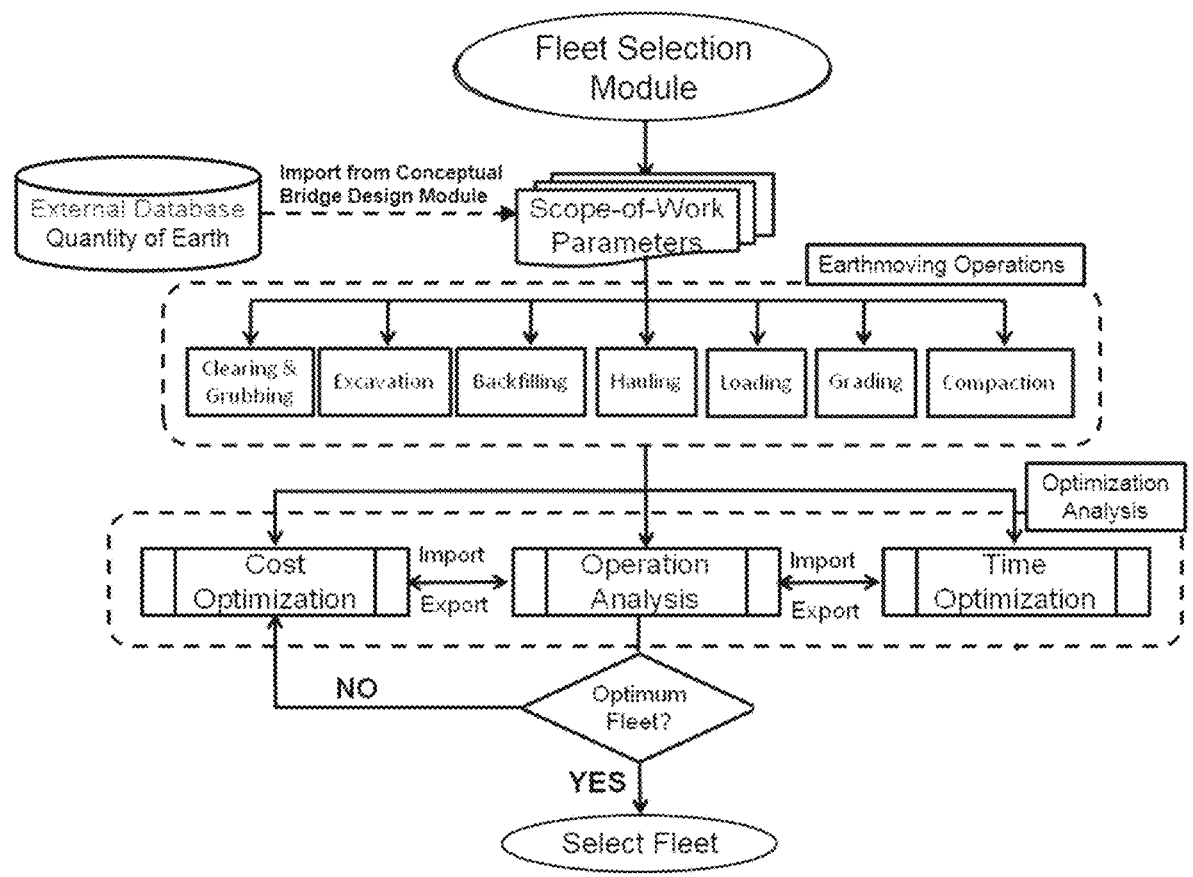
FIG. 21 is a flowchart detailing a process implemented by a fleet selection module from the application of FIG. 11.

FIG. 21 shows a detailed process chart for the fleet selection subsystem of the BrIMS application. As can be seen, this subsystem includes a database and a design module, as well as a fleet selection module itself. The fleet selection module shown here analyzes many factors relating to productivity, operations, and costs, and allows a user to accept, reject or modify fleet selections.

Figure 22:
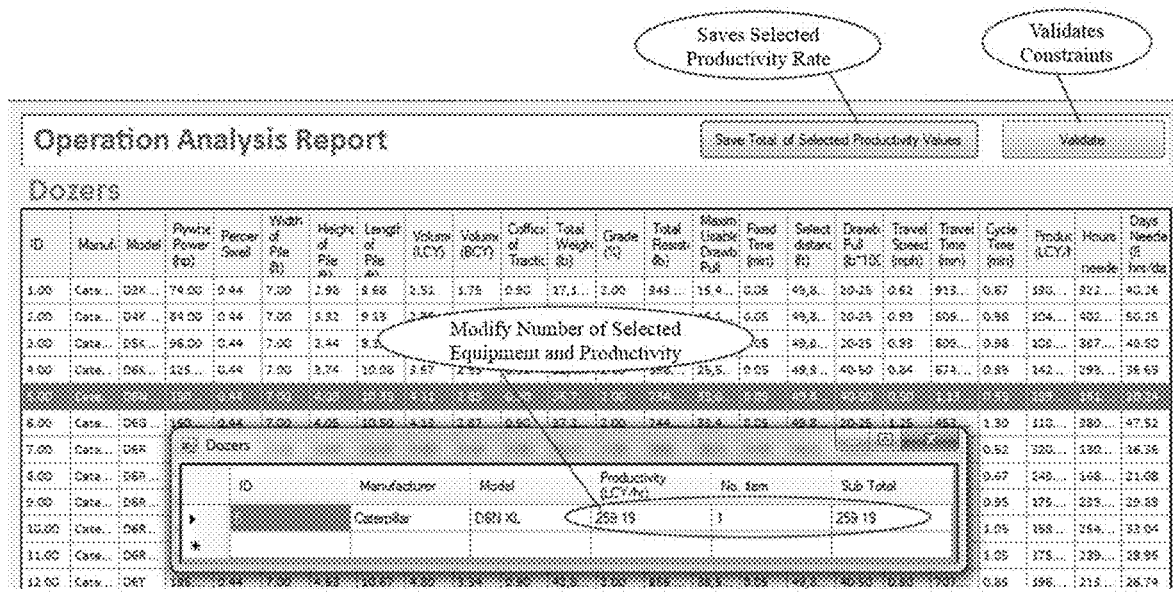
FIG. 22 is another screenshot from the application of FIG. 11, with editorial markings.
Figure 23:
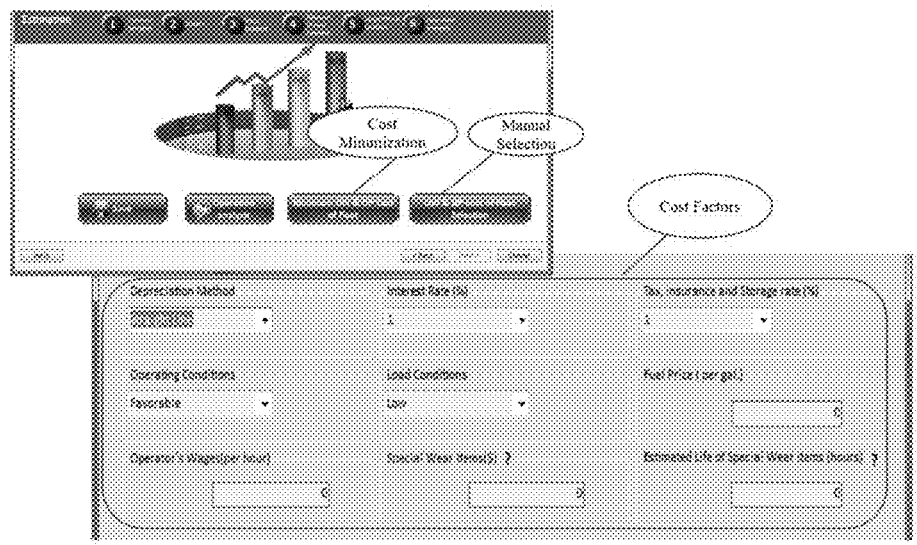
FIG. 23 shows multiple screenshots from the application of FIG. 11, with editorial markings.

The user then can input the volume of earthwork in BCY (bank cubic yards) to determine the productivity rates in LCY/hr (loose cubic yards per hour). Once the productivity rates are determined, the application displays an output report pertaining to the numerical analysis of the earthmoving operations where productivity rates of earthmoving operations equipment are tabulated. (A fleet is defined as a set of selected equipment that will result in the smallest ownership and operating costs.) As owning and operating costs are inversely proportional to equipment operation analysis, this fleet can be selected based on its productivity rate and cost. For example, if a particular equipment fleet has the maximum productivity rate, it will yield the least owning and operating costs and vice versa. The fleet is obtained by minimizing costs in a given mathematical model for a list of requirements and constraints that are represented as linear relationships. On the other hand, if the user requires a specific type and number of pieces of equipment, the user use a manual selection interface to modify the number of selected equipment pieces necessary to complete the operation, accompanied by corresponding productivity rates. Such a manual selection interface is shown in FIG. 22. Further, if the user selects the cost minimization option, the application automatically selects equipment to minimize owning and operation costs. On the other hand, if the user elects to manually select equipment, the application simply calculates the owning and operating costs of that selected equipment (as shown in FIG. 23), rather than trying to minimize the costs.

Cost Estimation

Figures 24, 25A:
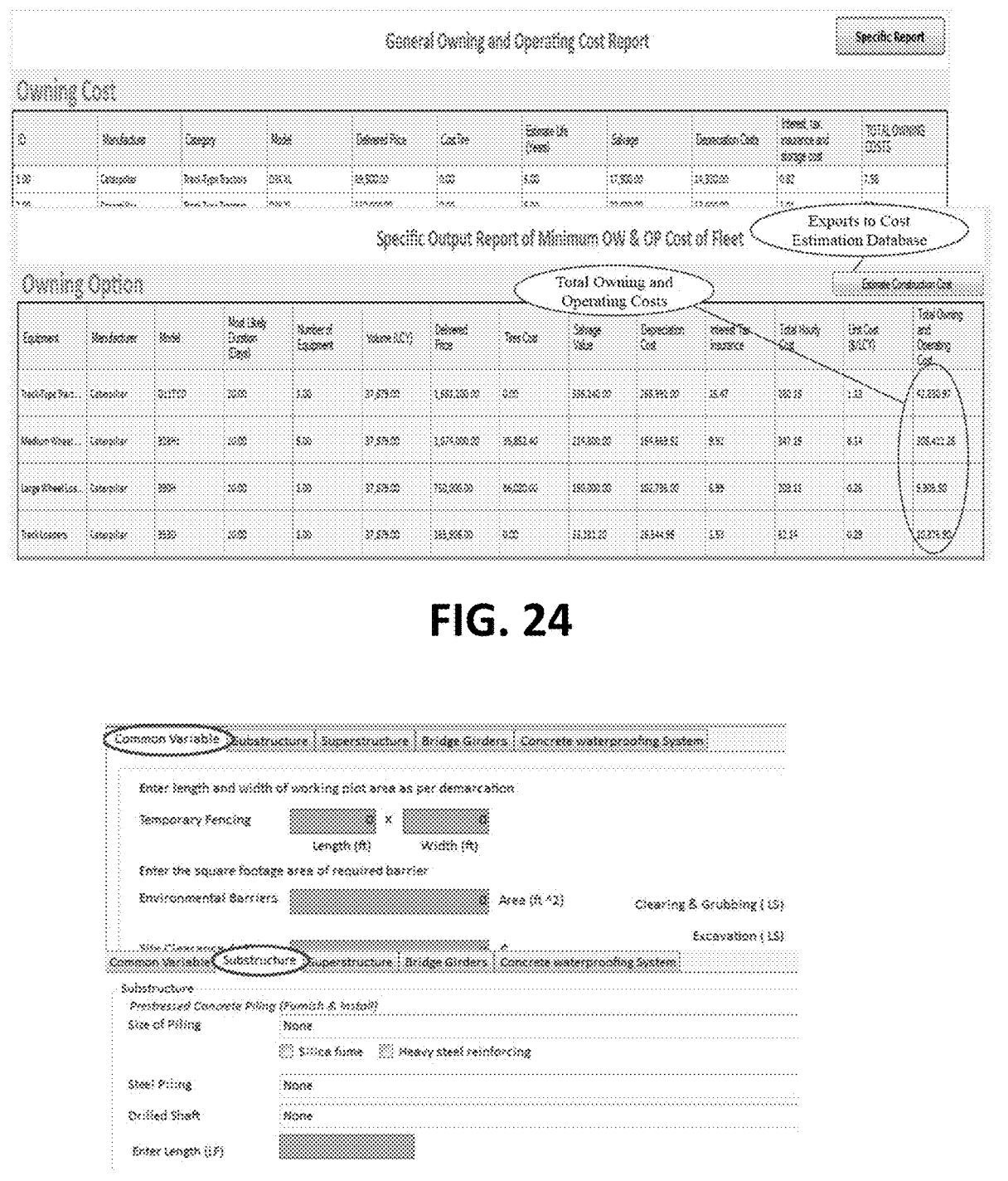

Once the fleet is selected, the application presents a generic report of owning and operating costs, followed by a specific report where total costs are tabulated. Thus, the user selects the fleet needed to complete the earthmoving operation and is informed of corresponding costs. Costs that are considered may include, but are not limited to ownership costs such as (a) fleet delivery price; (b) interest; (c) taxes; (d) insurance and storage; (e) depreciation; and (f) original tires, and operating costs such as (a) fuel; (b) service; (c) tire replacement; (d) emergency reserves; (e) wages; and (f) wear on items. This cost data is then automatically exported to, and stored in, a cost estimation database as shown in FIG. 24.

Figure 25B:
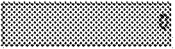
FIG. 25B shows multiple screenshots from the application of FIG. 11, with editorial markings.
Figure 26:
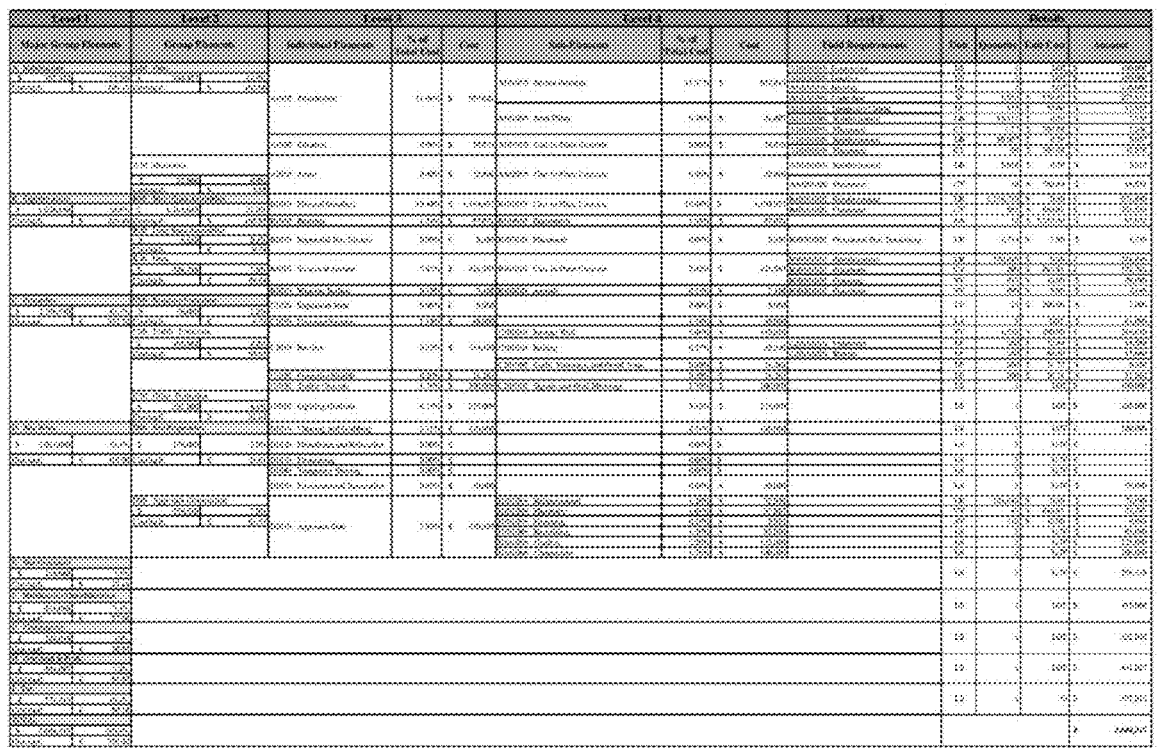
FIG. 26 is an output table from the application of FIG. 11.

The cost estimation module of this application may have the following sub-modules: (i) Common Variables; (ii) Substructure; (iii) Superstructure; (iv) Bridge Girders; and (v) Concrete Waterproofing System, which are accompanied by input forms as shown in FIGS. 25A and 25B. In these interfaces, the user inputs scope-of-work-related parameters pertaining to the desired bridge project. The application then automatically recalls bridge data from the plug-in tool and the design module. Total bridge construction costs are tabulated in a UNIFORMAT II elemental classification, as shown in FIG. 26.

Figure 27:
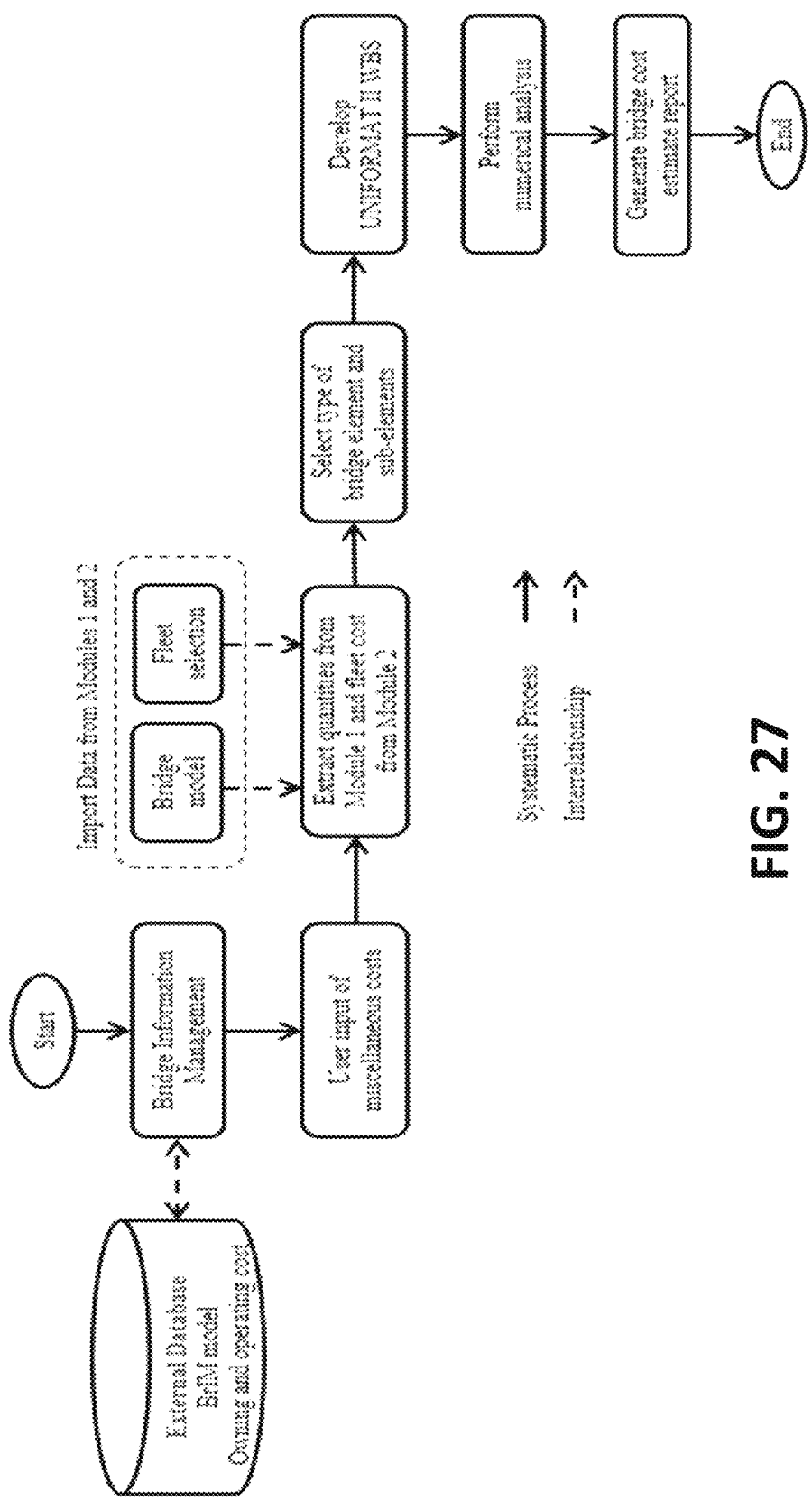
FIG. 27 is a flowchart detailing a process implemented by a cost estimation module from the application of FIG. 11.

FIG. 27 is a detailed diagram of a cost estimation sub-system as used comprising, in the pictured implementation, a database, a design module, a fleet selection module, and a cost-estimation module. Again, as would be clear, results from this cost-estimation sub-system may be presented directly to a user and/or used by other modules in a larger system.

Deterioration Forecasting

Figures 28, 29:
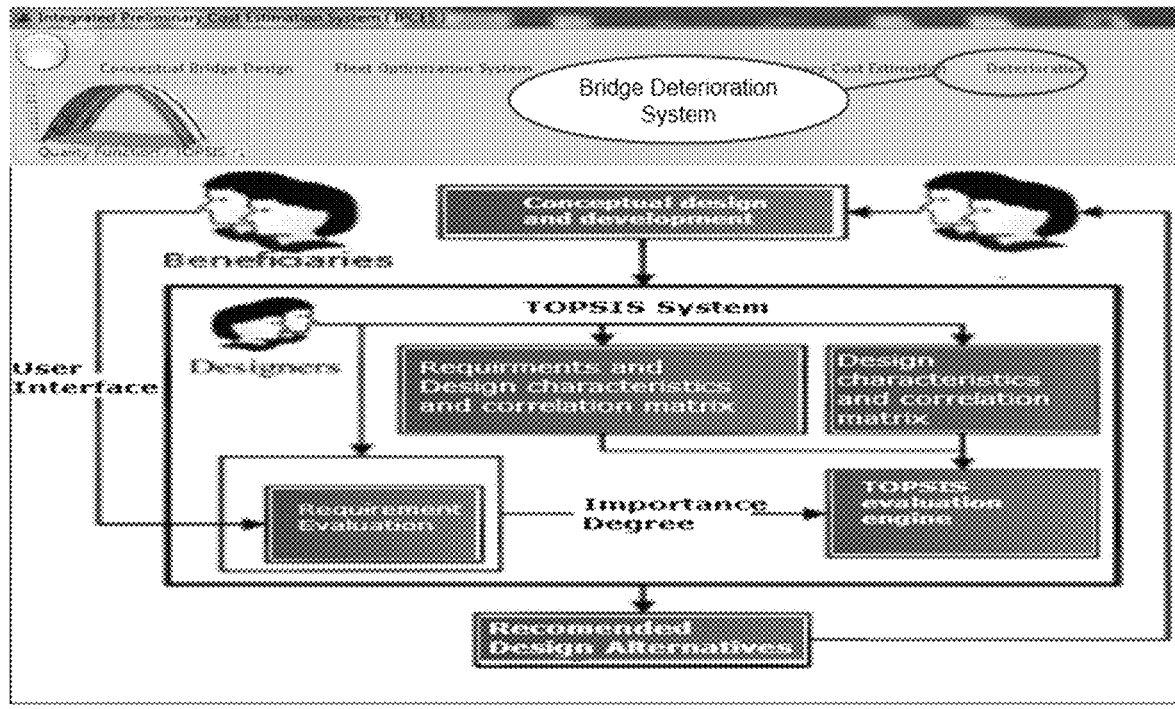
FIG. 28 is another screenshot from the application of FIG. 11, with editorial markings.
FIG. 29 is another screenshot from the application of FIG. 11, with editorial markings.

After cost estimation (in this implementation of the system), the user proceeds to the deterioration-forecast module, a screenshot of which is shown in FIG. 28. In this interface, the user can input an importance rating and a set of improvement goals for bridge components. Once the user selects the desired deterioration-forecast module (such as the "TOPSIS evaluation engine" or the "Recommended Design Alternatives"), the application displays an interface where the user inputs importance rating of bridge components, as shown in FIG. 29.

Figures 30, 31:
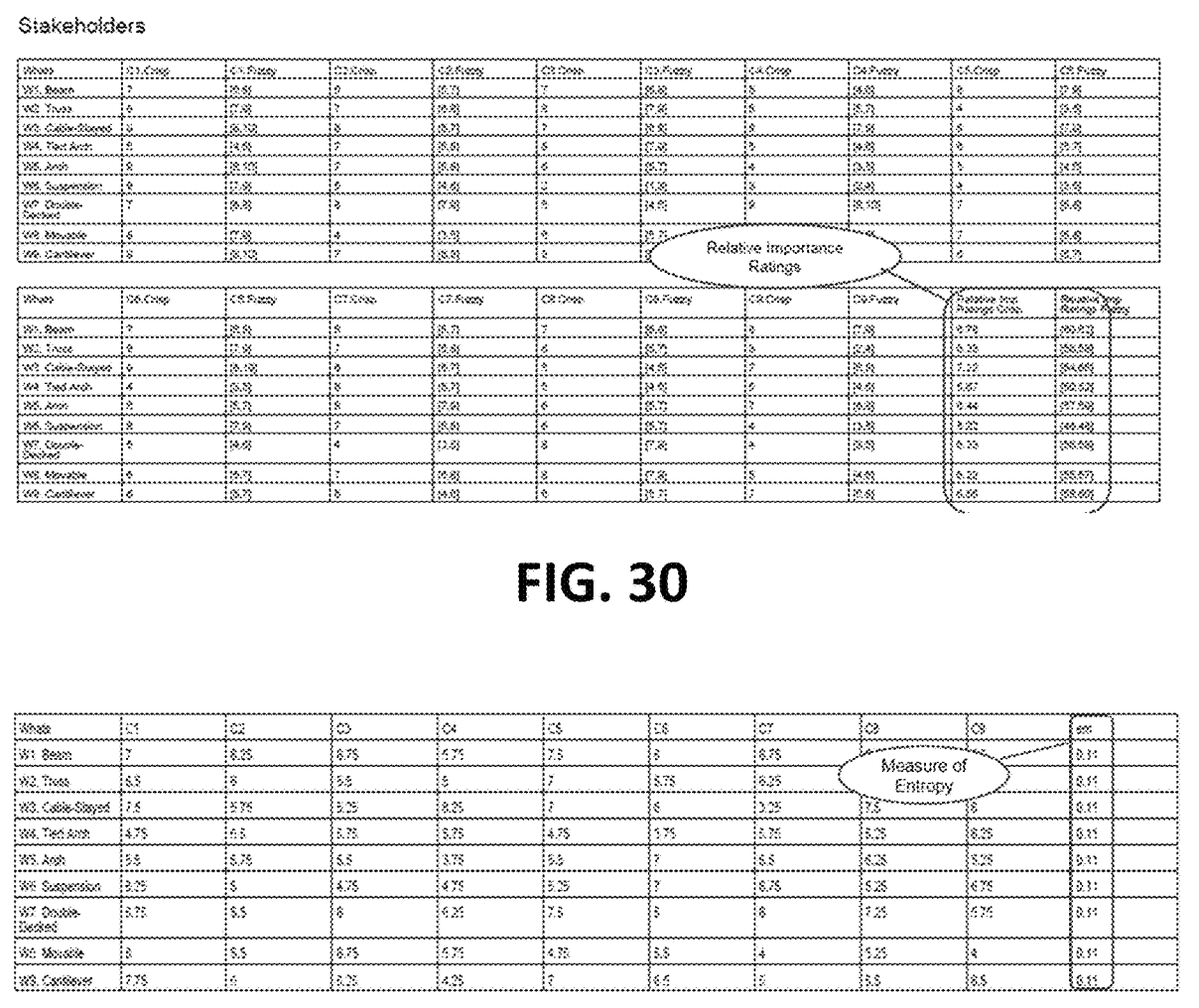
Figure 32:
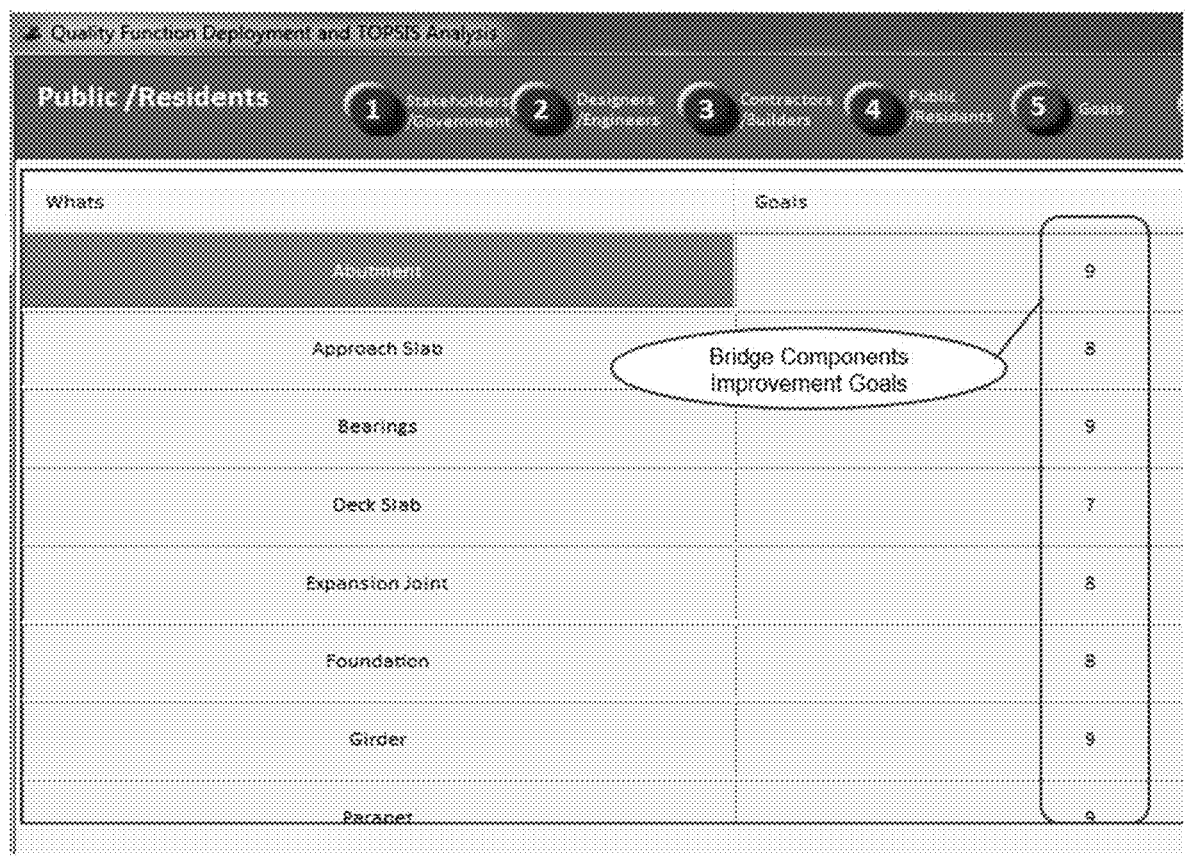
FIG. 32 is another screenshot from the application of FIG. 11, with editorial markings.

Relative importance rankings of various criteria (in both crisp and fuzzy forms) can then be obtained. FIG. 30 illustrates a ranking table of Government stakeholders using this application. Similar ranking and computation is conducted for the other stakeholders. A competitive matrix (shown in FIG. 31) for the various bridge users is then developed based on the rankings. FIG. 32 shows another interface in which the user can input a set of improvement goals for the bridge components. After the improvement goals are entered, the user can proceed with TOPSIS operations by clicking on 'TOPSIS Matrix', which will open the interface shown in FIG. 33.

The deterioration forecasting module uses the mathematical framework detailed above to implement the deterioration function as probabilistic distribution function such that a random deterioration variable, D, possesses a standard Gamma distribution of a distinguished shape parameter, γ, and a scale parameter, β, defined as in the following equation:

$$f_D(x) = \frac{\left(\frac{x}{\beta}\right)^{\gamma-1}}{\beta \Gamma(\gamma)} e^{\left(\frac{-x}{\beta}\right)} \text{ where; } x, \gamma, \text{ and } \beta \geq 0 \qquad (25)$$

where x is the deterioration parameter and Γ is the gamma function defined as follows:

$$\Gamma(\gamma) = \int_0^\infty x^{\gamma-1} e^{-x} dt \qquad (26)$$

For this implementation, a gamma model with shape and scale parameters greater than zero is assumed to be a continuous stochastic model if the following conditions are satisfied: i) probability of D(0)=0 is unity (i.e. 1); ii) D(t) comprises independent deterioration increments; and iii) increments follow a gamma function such that the mean and variance are determined as follows:

$$\mu[D(t)] = \gamma \times \beta \text{ and } \sigma^2[D(t)] = \gamma \times \beta^2 \qquad (27)$$

Regression analysis is then used to analyze the deterioration function. Although regression analysis is capable of modeling a data scatter, significant variance may be noticed in the manner in which it represents the actual data value. Testing the quality of fit of a regression analysis trend line is typically conducted by either of the two following procedures: 1) heuristic procedures, where manual inspection is conducted in parallel with an error minimization procedure; or 2) non-heuristic procedures, where hypothetical procedures such as the Chi-square test are deployed.

In order to ease the use of regression analysis, the manual inspection of trend line fitting with an error minimization procedure was adopted for this implementation since such fittings can be automatically generated with advanced modeling software available in the market. The procedure is based on adjusting the fitted trend line to minimize the error. The sum (E) of the squares of differences between the actual and proposed trend line fit is then minimized to obtain an adjustment factor that produces the best fit with the actual data scatter. The error minimization procedure is identified as per the following equation:

$$E_{min} = \sum_{i=1}^{n} \left[ \frac{d_{act,i} - a(d_{pro_i})}{\bar{d}_{act,i}} \right]^2 \qquad (28)$$

where $E_{min}$ is the minimized error, i=1 ... n is the number of actual data scatters, $d_{act,i}$ is the actual data value at the $i^{th}$ location, $d_{pro_i}$ is the proposed data value at the $i^{th}$ location, and a is a scaling factor to be applied to the proposed trend line. Note that the bracketed terms in equation (26) have been normalized with respect to the average of the actual data, which is given by the following equation:

$$\bar{d}_{act,i} = \frac{1}{n}\sum_{i=1}^{n} d_{act,i} \quad (29)$$

Note also that the resulting proposed trend line fit contributes towards an estimate of the shape and scale deterioration parameters such that error tolerances are respected.

This implementation of the deterioration forecasting module used machine-learning and artificial intelligence techniques. Filtering algorithms to determine interrelationships among deterioration parameters were therefore applied, to enhance overall dataset quality. In this implementation, a probabilistic matrix factorization technique was used to predict deterioration datasets for existing bridges while overcoming biased and over-fitted values. The model-based approach comprised four main processes: (1) singular value matrix decomposition (SVMD); (2) data normalization; (3) factorization; and (4) regularization.

Firstly, the matrix decomposition process was used to predict resistance deterioration values, $\mu[g(t)]$, of a bridge component, as follows:

$$\hat{r}_{ij} = p_i^T q_j = \Sigma_i^k p_{ik} q_{kj} \quad (30)$$

where $\hat{r}_{ij}$ is the predicted resistance deterioration; $p_i^T$ is the bridge preference factor vector; $q_j$ is the resistance deterioration factor vector; $p_{ik}$ is the bridge preference factor matrix; and $q_{kj}$ is the resistance deterioration factor matrix such that the dot product of $p_{ik}$ and $q_{kj}$ approximates the $\hat{r}_{ij}$. A gradient descent technique was then applied in order to determine the bridge preference and resistance deterioration factor vectors ($p_i^T$ and $q_j$).

The error between the predicted and actual resistance deterioration value was determined, to obtain a local minima of each 'bridge-resistance deterioration' pair, as in the following equation:

$$e^2_{ij} = (r^{ij} - r_{ij})^2 = (r_{ij} - \Sigma_1^k p_{ik} q_{ij})^2 \quad (31)$$

where $e^2_{ij}$ is the squared error difference; $r_{ij}$ is the actual resistance deterioration; $\hat{r}_{ij}$ is the predicted resistance deterioration; $p_{ik}$ is the bridge preference factor matrix; and $q_{kj}$ is the resistance deterioration factor matrix. Note that the squared error of the predicted and actual resistance deterioration data is used in order to account for over- or underestimated values.

The error was then minimized by taking the gradient of equation (29) with respect to $p_{ik}$, as follows:

$$\frac{\partial}{\partial p_{ik}} e^2_{ij} = -2(r_{ij} - \hat{r}_{ij})(q_{kj}) = -2e_{ij}q_{kj} \quad (32)$$

$$\frac{\partial}{\partial q_{ik}} e^2_{ij} = -2(r_{ij} - \hat{r}_{ij})(p_{ik}) = -2e_{ij}p_{ik}$$

which may be rearranged using a gradient descent value a:

$$p'_{ik} = p_{ik} + \alpha \frac{\partial}{\partial p_{ik}} e^2_{ij} = p_{ik} + 2\alpha e_{ij} q_{kj} \quad (33)$$

$$q'_{kj} = q_{kj} + \alpha \frac{\partial}{\partial q_{kj}} e^2_{ij} = q_{kj} + 2\alpha e_{ij} p_{ik}$$

where $p'_{ik}$ is the differentiated bridge preference factor matrix; $q'_{kj}$ is the differentiated resistance deterioration factor matrix; $e^2_{ij}$ is the squared error difference; and $e_{ij}$ is the error difference. Note that the $\alpha$ factor in equation (31) is the tolerance value that defines the rate of gradient descent approaching the minimum. In order to avoid excessive oscillations and bypassing local minima, a modification factor $\alpha$ with a value of 0.0002 was assumed in this implementation.

In this implementation, taking N as a finite ordered set of training data in the form of $(q_{kj}, p_{ik}, \hat{r}_{ij})$, the error $e_{ij}$ for each iterative dataset will be minimized when connotations between the attributes is learnt. Thus, the minimized error will converge as follows:

$$E = \Sigma_{(q_{kj}, p_{ik}, \hat{r}_{ij}) \in N} (r_{ij} - \Sigma_1^k p_{ik} q_{kj})^2 \quad (34)$$

where E is the minimized error value and $r_{ij}$ is the actual resistance deterioration.

Additionally, in order to avoid dataset over-fitting, a regularization process was implemented by incorporating a parameter factor $\gamma$ to regularize the magnitudes of the bridge-deterioration resistance factor vectors. Also, a regularization parameter $\gamma$ with a value of 0.02 was assumed, in order to avoid large number approximations and to achieve a better approximation of the bridge deterioration resistance capacity. The squared-error difference between the predicted and actual resistance deterioration value can then be written as:

$$e^2_{ij} = (r_{ij} - \hat{r}_{ij})^2 = \left(r_{ij} - \sum_1^k p_{ij} q_{ij}\right)^2 + \frac{\gamma}{2}\sum_1^k (\|p_{ik}\|^2 + \|q_{kj}\|^2) \quad (35)$$

and rearranged as:

$$p'_{ik} = p_{ik} + \alpha \frac{\partial}{\partial p_{ik}} e^2_{ij} = p_{ik} + \alpha(2e_{ij}q_{kj} - \gamma p_{ik}) \quad (36)$$

$$q'_{kj} = q_{kj} + \alpha \frac{\partial}{\partial q_{kj}} e^2_{ij} = q_{kj} + \alpha(2e_{ij}p_{ik} - \gamma q_{kj})$$

Figures 33, 34:
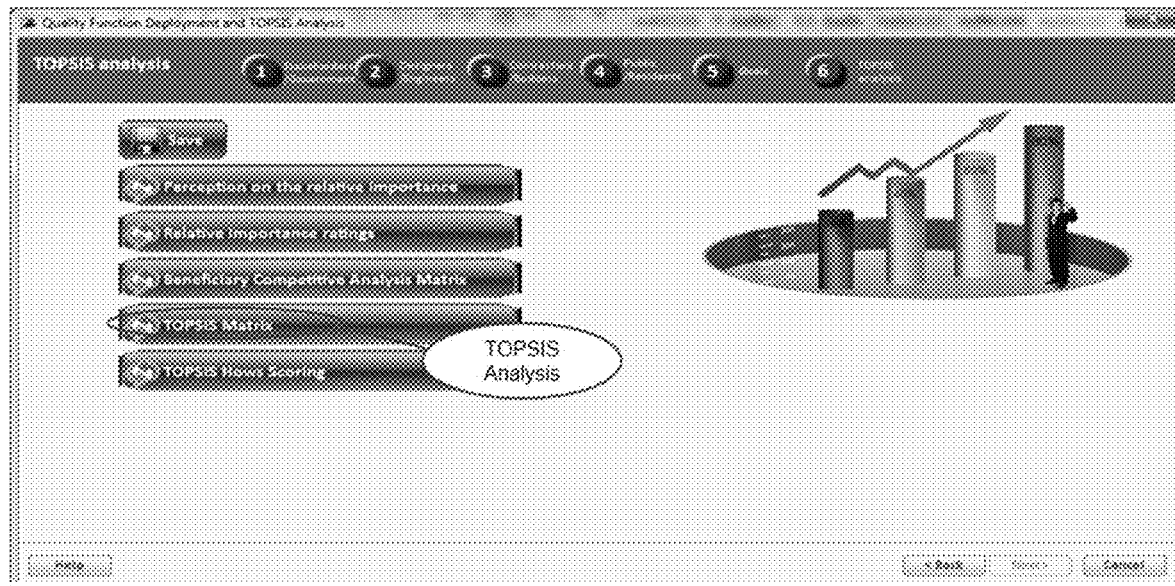
FIG. 33 is another screenshot from the application of FIG. 11, with editorial markings.
FIG. 34 shows multiple output tables from the application of FIG. 11.

Priority rankings for deterioration resulting from the TOPSIS analysis are shown in FIG. 34. In this figure, as can be seen, bridge components 'C1.Approach Slab', 'C5.Girder', and 'C4.Parapet' have the highest weights, followed by 'C8.Pier'; 'C3.Expansion Joint', 'C9.Foundation', and 'C2.Deck Slab'. 'C6.Bearings' and 'C7.Abutment' components have the lowest weights. Typically, bridges are designed taking into account the following main criteria: (1) Girder; (2) Pier; and (3) Foundation. However, deploying the complex quality function technique and incorporating additional bridge users (such as contractors/builders and public/residents) causes the relative importance of bridge components to change. This suggests that the resulting design will satisfy more stakeholders than the traditional models. As 'approach slab' and 'girder' components are typically the most expensive bridge components, and contribute significantly towards construction costs, it has been determined that their importance weight is highest. On the other hand, the bearings and abutment components are determined to possess the lowest importance weight.

Figures 35, 36:
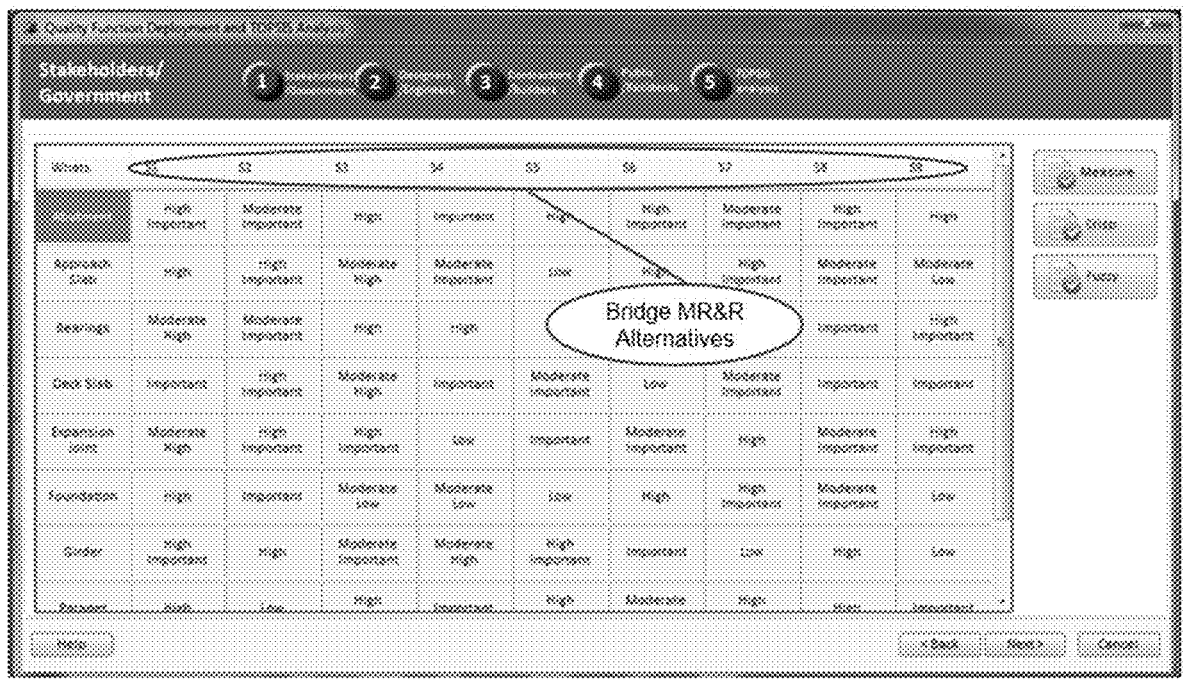
FIG. 35 is another screenshot from the application of FIG. 11, with editorial markings.
FIG. 36 is an output table from the application of FIG. 11.

Typically, bridge piers and foundation have been ranked first at the bridge conceptual design stage, since they are the major components for bridge projects. However, using this application, the bridge pier and foundation were ranked second based on bridge users' relative importance perception scorings. This implies that bridge users did not anticipate deterioration on piers to affect bridge performance, as opposed to the approach slab, girder, and parapet components. Following the determination of components rankings, the user is guided to a 'HOWs' scoring interface, where the user inputs importance ratings for bridge maintenance, repair, and replacement (MR&R) alternatives. A screenshot of such an interface is shown in FIG. 35. Following bridge user's assessment of the importance of bridge components on bridge MR&R alternatives, relative importance perception ratings in crisp and fuzzy forms are obtained. Afterwards, a bridge users' competitive matrix is developed. A corresponding probability distribution and measure of entropy along with competitive ranking of bridge components is then determined; a screenshot of such a matrix is shown in FIG. 36.

Note that improvement goals are set for each component, to evaluate the competitiveness rating amongst bridge components for diverse bridge type alternatives. Accordingly, corresponding improvement ratios and competitive ratings are determined. In FIG. 36, bridge component 'C1.Approach Slab' possesses the second highest importance weight and competitive rating, while 'C7.Abutment' is ranked first (contrasting with its position in the matrix of FIG. 34). However, 'C5.Girder' has dropped to the seventh ranking in FIG. 36, once improvement goals are taken into account. Similar trends are observed for the other bridge components, such as 'C3' and 'C4'. A TOPSIS matrix is then developed based on these improvement ratios, as illustrated in FIG. 37.

Figures 37, 38:
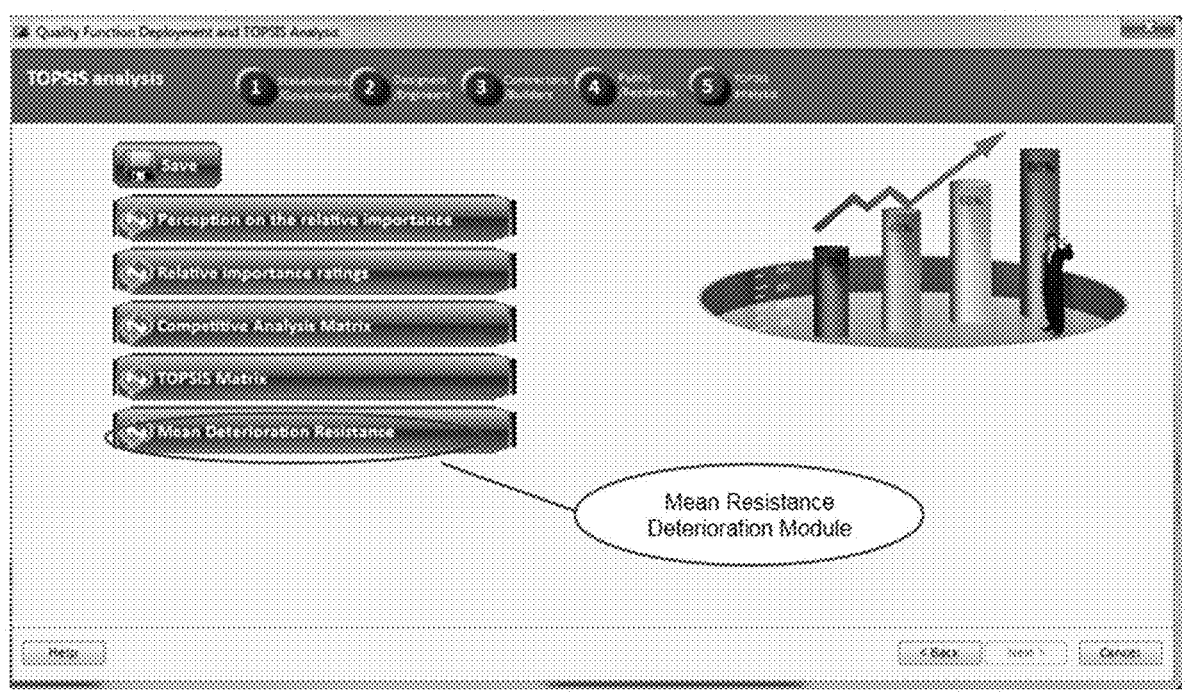
FIG. 37 is an output table from the application of FIG. 11.
FIG. 38 is another screenshot from the application of FIG. 11, with editorial markings.

In FIG. 37, 'C1.Approach Slab' has the highest TOPSIS weight and is thus the bridge component that requires further consideration at the conceptual design stage. Besides that, the MR&R solution 'S1.M15' (in this case, applying a maintenance solution when there is a 15% deterioration of the approach slab component) is most favoured. On the other hand, the 'REPA60' solution (applying a repair solution when the approach slab component has deteriorated by 60%), is the MR&R solution with the second rank. As can be seen, there is no preference for maintenance works once the deterioration of the approach slab exceeds 15%. Furthermore, the deterioration resistance capacity of the approach slab must be reconsidered at the conceptual design stage in order to withstand a 60% extent of deterioration.

A deterioration model for each of the bridge components is necessary to predict their time-dependent deterioration behavior. Hence, mean values of the resistance function for an 'approach slab' is obtained from previous similar bridges at diverse years throughout their service life. Upon obtaining mean resistance data, the user can then proceed with mean resistance deterioration module as shown in FIG. 38.

Figure 39:
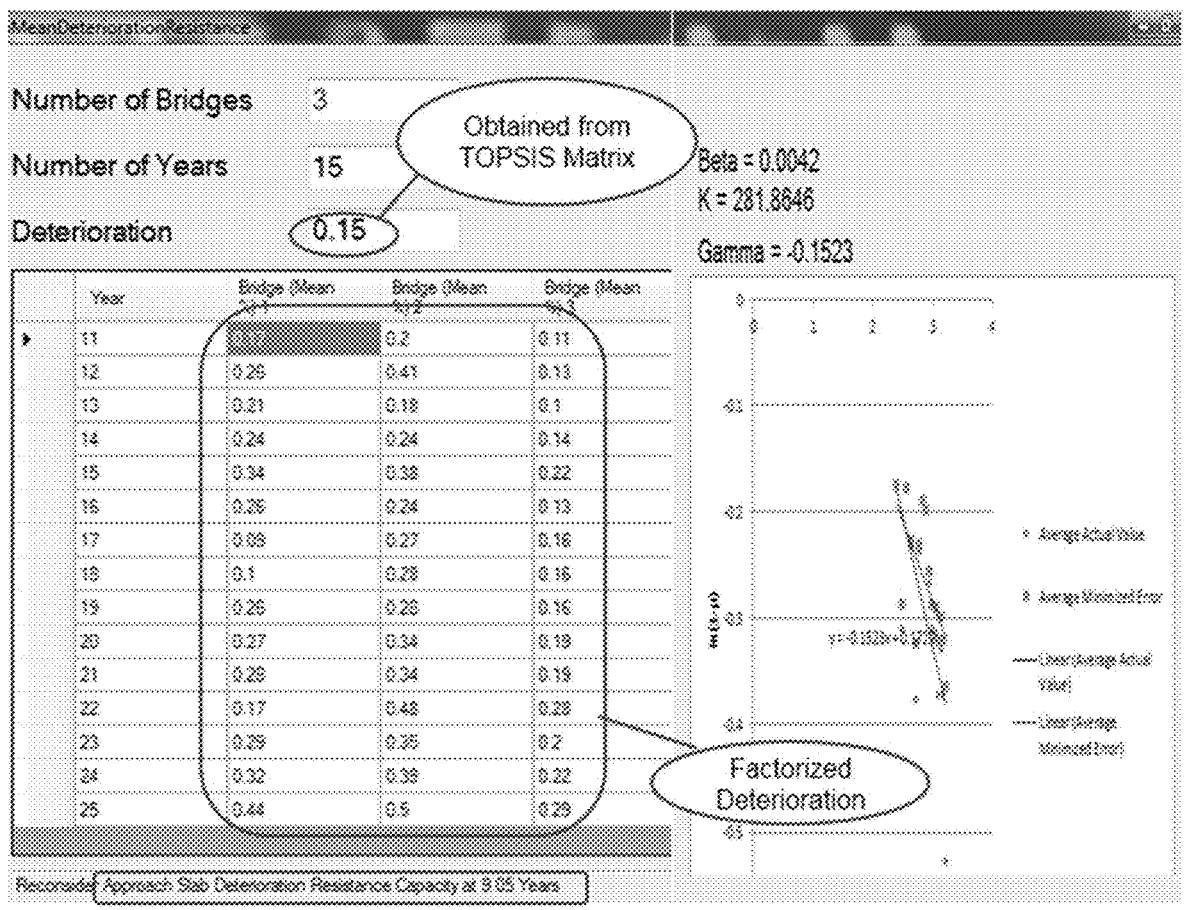
FIG. 39 is another screenshot from the application of FIG. 11, with editorial markings.

Afterwards, the user inputs the year and corresponding mean deterioration percentages, such that a regression analysis along with the quality of fit methodology may be deployed, as illustrated in the screenshot in FIG. 39. As can be seen in this figure, a probabilistic matrix factorization process is deployed to avoid biased and over-fitted values. The predicted data is then plotted in a scatter plot (at the lower right of the image), and a regression analysis is conducted on that data in order to determine the line of best fit. Afterwards, the deterioration parameters, $\hat{\gamma}$ and $\hat{\beta}$, are determined, where $\hat{\beta}$ and $\hat{\kappa}$ are computed as per a minimized, error-fitted trend line. The application then presents a recommendation statement, suggesting that the user reconsider the approach slab at the conceptual design stage. Reconsidering the approach slab and modifying the choice of material (or other parameters) could enhance its corresponding deterioration resistance capacity beyond 9 years.

Improvement goals for the deterioration forecast are then provided by the user. That is, the user can identify specific areas in the deterioration forecast that they would like to see improved. Identifying these goals may change the relative rankings of component importance: to re-arrange those rankings, further TOPSIS analysis may be required.

Task Scheduling

This bridge project system uses simulated annealing methods, as described above, to determine a suitable schedule for the infrastructure project. In this implementation, the simulated annealing algorithm comprises two main steps: (i) perturbation, and (ii) quality evaluation. At first, near-optimum problem solutions of X variables are defined as $X=\{x_1, x_2, x_3, \ldots x_M\}$, where X is the near-optimum solution, and $x_1, x_2, x_3, \ldots x_M$ are simulated annealing solutions to the linear scheduling problem. The duration-gradient process is then defined as $T=T_1, T_2, T_3, \ldots T_N$ where $T_1$ is the initial duration and $T_N$ is the final duration; and N is the number of durations. Duration values are discrete values selected based on a definitive convergence-gradient algorithm, which will be presented later. In order to enhance simulated annealing efficiency, a definitive number of iterative processes at each duration level are generated:

$$X_i = \{x_{1,i}, x_{2,i}, x_{3,i}, \ldots x_{M,i}\} \text{ where } i=1,2,3 \tag{37}$$

where i is the number of perturbations and $x_{1,i}$ is the value of $x_1$ following the $i^{th}$ perturbation.

Hence, the number of perturbations at the end of each duration level i is of value K, such that $X_K$ is the solution to the problem at the end of $T_i$. Generally, an error value is associated with each discrete solution, $X_i$. Therefore, $E_1, E_2, E_3$ are errors of the corresponding solutions $X_1, X_2, X_3$, respectively. That is, $E_1$ is the error for $X_1$, $E_2$ is the error for $X_2$, and so on.

Following the determination of error in the solutions, the quality of each solution is evaluated (as measured by an acceptance probability function). The metropolis algorithm in this implementation is used with the following acceptance probability function or "rule of acceptance" $R_a$:

$$R_a = \begin{cases} e^{\frac{-k\Delta E}{T}} & \Delta E > 0 \\ 1 & \Delta E \leq 0 \end{cases} \tag{38}$$

where $\Delta E$ is the solution error obtained due to the difference between the 'pre-perturbation' solution and the 'post-perturbation' solution; T is the set duration; and k is a constant determined based on the initial duration and its associated error as described in the following section. It was found that at very high durations, the algorithm is susceptible to accepting any solution. However, as the duration gradually decreases, the annealing process became more effective and the accepted solution highly dependent upon the error value. Thus, in this implementation, the duration-gradient process was controlled by gradually decreasing the duration, which was therefore a time-consuming process. However, the resulting solutions generally had a high chance of acceptance and high quality.

The constant k was carefully chosen in this implementation to reduce the time length of this annealing process, to thereby offset the lengthy gradual decreases described above. For instance, if k is equal to T (that is, if the constant is equal to the duration), the model is susceptible to a solution with a relatively low probability of acceptance and a relatively high corresponding error value. On the other hand, as the ratio of k to T approaches unity at the initial stage, the process is more likely to result in a solution with both a higher probability of acceptance and lower corresponding error value.

The value of the constant k in this implementation was determined according to an iterative process as described by the following equations:

$$\Delta E \approx \frac{1}{Q-1} \sum_{i=1}^{Q} E_i - \frac{1}{Q(Q-1)} \sum_{i=1}^{Q} (E_i)^2 \qquad (39)$$

$$k = \frac{T_0 \ln(0.8)}{\Delta E} \qquad (40)$$

where $\Delta E$ is the difference in errors estimate; Q is the number of perturbations; and $T_0$ is the initial duration. Note that, at the initial stage, the value of $\Delta E$ is an estimate, as indicated in equation (37). Following that stage, once the value of $\Delta E$ is determined, the k-value is determined in accordance with equation (38). From there, the k-value is directly substituted into equation (36) to determine an acceptance value against which to measure possible scheduling solutions.

Figure 40:
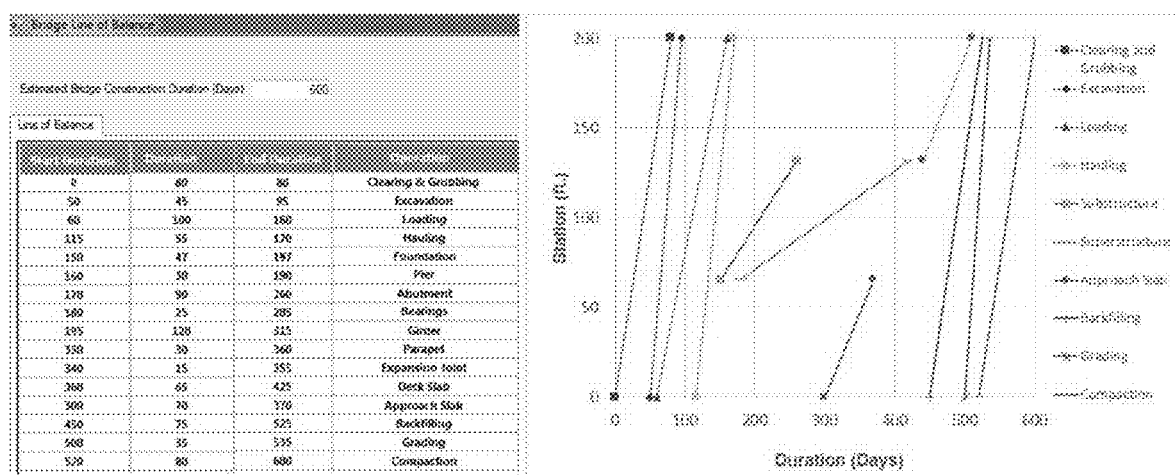
FIG. 40 shows a screenshot from the application of FIG. 11 and an output schedule plot from that application.

FIG. 40 shows an interface (at left) and a line-of-balance plot output from the scheduling module of this bridge-focussed implementation of the invention. This module schedules and plots earthmoving operations and component construction. As illustrated in this figure, bridge elements are categorized into two main categories: 'Substructure', which includes: (1) foundation; (2) pier; and (3) abutment, and 'Superstructure', which includes: (1) bearings; (2) girder; (3) parapet; (4) expansion joint; and (5) deck slab. Note that the construction of the bridge substructure and superstructure is scheduled to start one-third of the span between 'station-50 ft.' and 'station-100 ft.', and to end at two-thirds of the span between 'station-100 ft.' and 'station-150 ft.' (That is, construction of the substructure and superstructure will begin at one side of the bridge and move towards the other end.) On the other hand, the construction of the approach slab is scheduled to start at 'station-0ft.' 120 days after the start of superstructure construction (the approach slab on the first side of the bridge) and to resume at two-thirds of the span between 'station-100 ft' and 'station-150 ft' (the approach slab on the other side of the bridge), once the bridge superstructure has been completed.

Note again that the results of this exemplary bridge information management system, and of other systems designed in accordance with the present invention, are preliminary results intended for use at the conceptual design stage. That is, the results of this system are not yet robust enough to support bidding proposals or other later stage planning operations. Additionally, there is still relatively little data related to some aspects of infrastructure projects. For instance, much of the data gathered to support estimates of earthmoving times for a bridge project was subjective and dependent on individual circumstance. Additionally, factors such as soil type may affect earthmoving and other construction tasks, yet are not always reflected in gathered data. In other words, where more data is available, the accuracy of the system's results will likely improve; thus, larger and more objective data sets are generally preferable.

This example should be understood as one of many possible implementations of the present invention. The above example should, therefore, not be taken as limiting the scope of the present invention. Similarly, the applications interfaces created for this implementation should not be taken as limiting the scope of the present invention.

It should be clear that the various aspects of the present invention may be implemented as software modules in an overall software system. As such, the present invention may thus take the form of computer executable instructions that, when executed, implements various software modules with predefined functions.

The embodiments of the invention may be executed by a computer processor or similar device programmed in the manner of method steps, or may be executed by an electronic system which is provided with means for executing these steps. Similarly, an electronic memory means such as computer diskettes, CD-ROMs, Random Access Memory (RAM), Read Only Memory (ROM) or similar computer software storage media known in the art, may be programmed to execute such method steps. As well, electronic signals representing these method steps may also be transmitted via a communication network.

Embodiments of the invention may be implemented in any conventional computer programming language. For example, preferred embodiments may be implemented in a procedural programming language (e.g., "C" or "Go") or an object-oriented language (e.g., "C++", "java", "PHP", "PYTHON" or "C#"). Alternative embodiments of the invention may be implemented as pre-programmed hardware elements, other related components, or as a combination of hardware and software components.

Embodiments can be implemented as a computer program product for use with a computer system. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques). The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink-wrapped software), preloaded with a computer system (e.g., on system ROM or fixed disk), or distributed from a server over a network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

A person understanding this invention may now conceive of alternative structures and embodiments or variations of the above all of which are intended to fall within the scope of the invention as defined in the claims that follow.

I claim:

1. A system for scheduling tasks related to an infrastructure project, said system comprising:
   - an input module for receiving input data related to said infrastructure project;
   - a design module for recommending a design of said infrastructure project to a user;
   - a fleet selection module for identifying logistical needs of said infrastructure project, wherein said needs are identified based on said input data; and
   - a scheduling module for identifying said tasks and for producing a schedule for said tasks, wherein said tasks are identified and scheduled based on said design and on said logistical needs.

2. The system according to claim 1, wherein at least one of said tasks and said logistical needs are identified based on previous known data.

3. The system according to claim 1, further comprising at least one database in operative communication with at least one of said fleet selection module and said scheduling module.

4. The system according to claim 1, further comprising at least one machine-learning based module.

5. The system according to claim 1, wherein said infrastructure project is a construction of a bridge.

6. A system for making recommendations related to an infrastructure project, said system comprising:
   - an input module for receiving project-related data from a user;
   - a design module for performing at least one analysis of said project-related data, and for, based on said analysis, recommending a design for said infrastructure project and components of said infrastructure project to said user;
   - a fleet selection module for predicting logistical needs of said infrastructure project;
   - a cost estimation module for predicting costs related to said infrastructure project;
   - a deterioration-forecaster module for predicting deterioration values of said components; and
   - a scheduling module for identifying tasks related to said infrastructure project and for producing a schedule of said tasks, wherein said tasks are identified and scheduled based on said design and on said logistical needs.

7. The system according to claim 6, wherein said logistical needs, said costs, said deterioration, and said schedule are presented to said user for approval.

8. The system according to claim 6, further comprising at least one database in operative communication with at least one of said design module, said fleet selection module, said cost estimation module, said deterioration-forecaster module, and said scheduling module.

9. The system according to claim 6, wherein at least one of said design module, said fleet selection module, said cost estimation module, said deterioration-forecaster module, and said scheduling module uses fuzzy logic.

10. The system according to claim 6, wherein at least one of said design module, said fleet selection module, said cost estimation module, said deterioration-forecaster module, and said scheduling module uses machine learning.

11. The system according to claim 6, wherein said infrastructure project is a construction of a bridge.

* * * * *